(12) United States Patent
Leng

(10) Patent No.: US 12,414,359 B2
(45) Date of Patent: *Sep. 9, 2025

(54) INTEGRATED CIRCUIT STRUCTURE INCLUDING A METAL-INSULATOR-METAL (MIM) CAPACITOR MODULE AND A THIN-FILM RESISTOR (TFR) MODULE

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 663 days.

This patent is subject to a terminal disclaimer.

(21) Appl. No.: 17/536,597

(22) Filed: Nov. 29, 2021

(65) Prior Publication Data

US 2023/0081749 A1 Mar. 16, 2023

Related U.S. Application Data

(60) Provisional application No. 63/244,366, filed on Sep. 15, 2021.

(51) Int. Cl.
*H10D 84/80* (2025.01)
*H01L 23/522* (2006.01)
(Continued)

(52) U.S. Cl.
CPC ....... *H10D 84/811* (2025.01); *H01L 23/5223* (2013.01); *H01L 23/5226* (2013.01);
(Continued)

(58) Field of Classification Search
CPC ............. H01L 23/481; H01L 21/76898; H01L 2225/06544; H01L 25/0657; H01L 28/40;
(Continued)

(56) References Cited

U.S. PATENT DOCUMENTS

| 6,365,480 B1 | 4/2002 | Huppert et al. ............... 438/381 |
| 11,769,793 B2 * | 9/2023 | Leng .................... H01L 23/5226 257/532 |

(Continued)

OTHER PUBLICATIONS

International Search Report and Written Opinion, Application No. PCT/US2022/019450, 11 pages, Jun. 13, 2022.

(Continued)

*Primary Examiner* — Eliseo Ramos Feliciano
*Assistant Examiner* — Brad A Knudson
(74) *Attorney, Agent, or Firm* — SLAYDEN GRUBERT BEARD PLLC

(57) ABSTRACT

An integrated circuit structure including a metal-insulator-metal (MIM) capacitor module and a thin-film resistor (TFR) module is provided. The MIM capacitor module includes a bottom electrode base formed in a lower metal layer, a bottom electrode formed in a dielectric region between the lower metal layer and an upper metal layer, an insulator formed over the bottom electrode, and a top electrode formed in the upper metal layer over the insulator. The bottom electrode includes a cup-shaped bottom electrode component and a bottom electrode fill component formed in an interior opening defined by the cup-shaped bottom electrode component. The TFR module includes a pair of metal heads formed in the dielectric region and a resistor element connected across the pair of metal heads.

(Continued)

Each metal head includes a cup-shaped head component and a head fill component formed in an interior opening defined by the cup-shaped head component.

14 Claims, 18 Drawing Sheets

(51) Int. Cl.

| | | |
|---|---|---|
| *H01L 23/532* | (2006.01) | |
| *H10D 1/00* | (2025.01) | |
| *H10D 1/68* | (2025.01) | |
| *H10D 84/01* | (2025.01) | |
| *H01L 21/768* | (2006.01) | |
| *H10D 1/47* | (2025.01) | |
| *H10D 84/00* | (2025.01) | |
| *H10D 86/80* | (2025.01) | |

(52) U.S. Cl.
CPC .... *H01L 23/5228* (2013.01); *H01L 23/53266* (2013.01); *H10D 1/00* (2025.01); *H10D 1/696* (2025.01); *H10D 84/01* (2025.01); *H01L 21/7684* (2013.01); *H01L 21/76843* (2013.01); *H01L 21/76885* (2013.01); *H10D 1/47* (2025.01); *H10D 1/68* (2025.01); *H10D 1/692* (2025.01); *H10D 84/206* (2025.01); *H10D 86/80* (2025.01)

(58) Field of Classification Search
CPC ..... H01L 28/20; H01L 28/60; H01L 21/7687; H01L 23/5226; H01L 28/00; H01L 21/7684; H01L 21/76843; H01L 21/76885; H01L 23/5223; H01L 23/5228; H01L 23/53266; H01L 23/647; H01L 27/016; H10D 84/206; H10D 1/00; H10D 1/696; H10D 84/01; H10D 1/47; H10D 1/68; H10D 1/692; H10D 86/80; H10D 84/811

See application file for complete search history.

(56) References Cited

U.S. PATENT DOCUMENTS

| | | | |
|---|---|---|---|
| 2002/0163029 A1 | 11/2002 | Dirnecker et al. ............ 257/306 |
| 2002/0179955 A1* | 12/2002 | Morimoto .......... H01L 23/5223 |
| | | | 257/E21.582 |
| 2002/0197844 A1* | 12/2002 | Johnson .............. H01L 23/5228 |
| | | | 257/E21.582 |
| 2005/0067701 A1 | 3/2005 | Coolbaugh et al. .......... 257/751 |
| 2007/0138531 A1* | 6/2007 | Tu .......................... H10D 1/716 |
| | | | 257/E27.087 |
| 2007/0152258 A1* | 7/2007 | Kim .................... H01L 23/5223 |
| | | | 257/E21.011 |
| 2011/0032659 A1* | 2/2011 | Dunn ................... H01G 4/1209 |
| | | | 216/6 |
| 2015/0348908 A1* | 12/2015 | Nagakura ............. H01L 23/528 |
| | | | 257/536 |
| 2016/0197135 A1 | 7/2016 | Hao et al. ...................... 257/537 |
| 2016/0218062 A1 | 7/2016 | Aggarwal et al. ............ 257/537 |
| 2019/0392967 A1 | 12/2019 | Leng et al. |

OTHER PUBLICATIONS

German Office Action, Application No. 112022004397.0, 9 pages Jun. 27, 2025.

* cited by examiner

INTEGRATED CIRCUIT STRUCTURE INCLUDING A METAL-INSULATOR-METAL (MIM) CAPACITOR MODULE AND A THIN-FILM RESISTOR (TFR) MODULE

RELATED PATENT APPLICATION

This application claims priority to commonly owned U.S. Provisional Patent Application No. 63/244,366 filed Sep. 15, 2021, the entire contents of which are hereby incorporated by reference for all purposes.

TECHNICAL FIELD

The present disclosure relates to analog components formed in integrated circuit devices, and more particularly to an integrated circuit structure including a metal-insulator-metal (MIM) capacitor module and a thin-film resistor (TFR) module.

BACKGROUND

Capacitors and resistors formed monolithically in integrated circuit devices are referred to as integrated capacitors and resistors, respectively. Integrated capacitors and resistors are common elements in many integrated circuit devices. For example, various analog, mixed signal, and RF-CMOS (radio-frequency complimentary metal-oxide-semiconductor) integrated circuit devices use integrated capacitors and resistors, either separately or in combination with each other. Integrated capacitors and resistors may offer various advantages over discrete counterparts (i.e., off-chip capacitors and resistors). For example, as compared with typical discrete (off-chip) capacitors and resistors, integrated capacitors and resistors may often be produced at lower cost. Additionally, system-on-chip devices including integrated capacitors and resistors may have a reduced pin count (which may provide improved ease-of-use and form factor), and may exhibit a reduced parasitic capacitance.

MIM capacitor modules are typically constructed between two interconnect metal layers (e.g., aluminum layers), referred to as metal layers $M_x$ and $M_{x+1}$. For example, a MIM capacitor module may be formed using an existing metal layer $M_x$ as the bottom electrode (bottom plate), constructing an insulator and a top electrode (top plate) over the bottom electrode, and connecting an overlying metal layer $M_{x+1}$ to the top and bottom electrodes by respective vias. The top electrode formed between the two metal layers $M_x$ and $M_{x+1}$ may be formed from a different metal than the metal layers $M_x$ and $M_{x+1}$. For example, the metal layers $M_x$ and $M_{x+1}$ may be formed from aluminum, whereas the top electrode may be formed from titanium/titanium nitride (Ti/TiN), tantalum/tantalum nitride (Ta/TaN), or tungsten (W), for example.

The top electrode typically has a higher resistance than the bottom electrode, for example because the top electrode may be limited by thickness constraints and the material of choice, thus limiting the performance of conventional MIM capacitor modules. MIM capacitor modules typically have very narrow process margins, particularly for a metal etch used to form the top electrode.

In addition, for MIM capacitor modules formed in aluminum interconnect (i.e., where metal layers $M_x$ and $M_{x+1}$ comprise aluminum interconnect layers), the aluminum bottom electrode may be susceptible to hillock formation at a top side of the bottom electrode, e.g., resulting from high-temperature processing of aluminum, a low-melting-point metal. Hillocks formed on the bottom electrode may negatively or unpredictably affect the breakdown voltage of the MIM capacitor module.

FIGS. 1A-1F show cross-sectional side views of an example prior art process for forming an MIM capacitor module 10. As shown in FIG. 1A, a metal interconnect layer $M_x$ is formed over a dielectric region, e.g., an inter-metal dielectric (IMD) layer indicated as $IMD_x$. Metal layer $M_x$ may be formed from aluminum or other suitable metal.

Next, as shown in FIG. 1B, an insulator layer 100 is deposited, followed by a top electrode layer 102 from which a top electrode (top plate) of the MIM capacitor module 10 is formed, as shown in FIG. 1C discussed below. The insulator layer 100 may comprise silicon nitride ($Si_3N_4$, also referred to more simply as SiN) with a thickness $T_{ins}$ of about 500 Å, which may be deposited by a plasma enhanced chemical vapor deposition (PECVD) process. The top electrode layer 102 may comprise titanium nitride (TiN), tantalum (Ta), tantalum nitride (TaN), or other suitable metal with thickness $T_{te}$ of about 2000 Å. The thickness $T_{te}$ of the top electrode layer 102, which defines the thickness of the capacitor top electrode 108 (see FIG. 1C), is typically limited by the thickness of a subsequently formed IMD layer $IMD_{x+1}$ (shown in FIG. 1F discussed below). In addition, an etch margin of the top electrode etch (see FIG. 1C, discussed below), and a process margin of a subsequent chemical mechanical planarization (CMP), for example, may contribute to the limitation on the thickness $T_{te}$ of the top electrode layer 102. For a typical $IMD_{x+1}$ layer thickness of 8000 Å, the thickness $T_{te}$ of the top electrode 102 may be limited to about 3000 Å or less. This limited thickness $T_{te}$ of the top electrode layer 102 (and thus capacitor top electrode 108) can result in a high series resistance and low quality factor (Q-factor) for certain applications, e.g., radio frequency (RF) applications.

After the insulator layer 100 and top electrode layer 102 are deposited, information printed in the wafer scribe region of the underlying silicon substrate may be very difficult to read (through top electrode layer 102, the insulator layer 100, and underlying metal layer $M_x$), which can cause manufacturing problems. For example, the wafer lot number and/or wafer number printed in the wafer scribe region may be difficult to read, which may cause various problems, e.g., inability to run controlled experiments with designated wafers split among different process conditions or record wafer activities (e.g., scrap or incident events) tied to wafer number.

Next, as shown in FIG. 1C, a photoresist layer is deposited and patterned to form a first photomask 106 over the top electrode layer 102, and an etch is performed to define the MIM capacitor top electrode 108 from the top electrode layer 102, wherein the portion of the insulator layer 100 below the MIM capacitor top electrode 108 defines the MIM capacitor insulator, indicated at 100a. The top electrode etch typically has a very small process margin. In particular, the etch is designed to stop approximately halfway through the thickness $T_{ins}$ of the insulator layer 100.

The precise depth of the top electrode etch, which defines the thickness $T_{ins\_etched}$ of the remaining insulator layer 100 outside the footprint of the top electrode 108, indicated as etched insulator layer region 100b, is typically sensitive to specific process parameters, such as silicon nitride deposition thickness and non-uniformity, and etch uniformity and selectivity, for example. If the etch is insufficiently deep (such that $T_{ins\_etched}$ of the etched insulator layer region 100b is too thick), the top electrode layer 102 may not be completely removed in some areas on the wafer (e.g., due to non-uniformity of the etch across the wafer), thus leaving metal residue or stringers on the wafer. These metal residue or stringers may cause incomplete etching in a subsequent metal etch step, create metal shorts, and lead to device yield loss or reliability failure.

On the other hand, if the top electrode etch is too deep (such that $T_{ins\_etched}$ of the etched insulator layer region 100b is too thin), the resulting MIM capacitor module 10 may have an unsuitably low breakdown voltage, in particular due to the corner "C" formed in the insulator layer 100 by the top electrode etch discussed above, as discussed below with respect to FIG. 1F.

Thus, the effective margin for the thickness $T_{ins\_etched}$ of the etched insulator layer region 100b may be very small, thereby defining small process margins for the top electrode etch. For example, for a deposited silicon nitride insulator layer having a thickness $T_{ins}$ of 500Å, an effective target thickness $T_{ins\_etched}$ of the etched insulator layer region 100b may have a very small margin, for example between 230-270 Å.

Next, as shown in FIG. 1D, remaining portions of the first photomask 106 are removed and a new photoresist layer is deposited and patterned to form a second photomask 112 over the top electrode 108 and extending beyond the top electrode 108 in a first lateral direction.

Next, as shown in FIG. 1E, a metal etch is performed to define the MIM capacitor bottom electrode 116.

Finally, as shown in FIG. 1F, construction of the MIM capacitor module 10 is completed by removing the second photomask 112, forming an IMD layer ($IMD_{x+1}$), forming vias 120 respectively contacting the top electrode 108 and bottom electrode 116, and forming a top electrode contact 122 and a bottom electrode contact 124 in a metal layer $M_{x+1}$ over the $IMD_{x+1}$ layer.

The prior art MIM capacitor module 10 may suffer from various shortcomings. For example, as noted above, the thickness $T_{te}$ of the top electrode 108 may be limited due to a vertical spacing limitation between metal layers $M_x$ and $M_{x+1}$, represented by the thickness $T_{IMDx+1}$ of the $IMD_{x+1}$ region. The limited thickness $T_{te}$ of the top electrode 108 may result in high serial resistance unsuitable for certain applications (e.g., RF applications).

In addition, the MIM capacitor module 10 may have a low and/or unpredictable breakdown voltage. For example, the capacitor breakdown voltage may be very sensitive to the thickness $T_{ins\_etched}$ of the etched insulator layer region 100b, particularly at the corner C below the lateral edge of the top electrode 108, as discussed above. In addition, the capacitor breakdown voltage may also be sensitive to hillocks "H" formed on the capacitor bottom electrode 116. Hillock formation may be very difficult to control in the fabrication process discussed above. For example, hillocks H may form on the bottom electrode 116 as a result of various heated process steps during and after the capacitor module fabrication, including heat treatment steps and/or heated aluminum deposition steps (e.g., performed at 400° C.). These hillocks H may create an uncontrolled low breakdown voltage of the capacitor module 10.

In addition, as noted above, the deposition of the various material layers (lower metal layer, insulation layer, and top electrode layer) over the wafer scribe region may hinder the ability to read information printed in the wafer scribe region (e.g., wafer number and lot number), which may complicate the manufacturing process.

Turning now to integrated resistors, one common type is the thin-film resistor (TFR) module, which includes a pair of metal heads connected by a resistor element, or TFR film.

FIG. 2 shows a cross-sectional view of two example TFR modules 200A and 200B implemented using conventional techniques. The fabrication of a conventional TFR module 200A or 200B typically requires three added mask layers, with reference to a background fabrication process for the relevant IC device. In particular, a first added mask layer may be used to create metal heads 202A and 202B, a second added mask layer may be used to create a resistor element 204, and a third added mask layer may be used to create TFR vias 206A and 206B. As shown, the resistor element 204 of TFR module 200A is formed across the top of the metal heads 202A and 202B, while the resistor element 204 of TFR module 200B is formed across the bottom of the metal heads 202A and 202B, but each design typically uses three added mask layers.

TFR modules and MIM capacitor modules are often expensive to construct. For example, as discussed above, the process for forming an MIM capacitor module or TFR module often includes multiple additional mask layer to the background IC fabrication process. Also, MIM capacitor modules and TFR modules are typically constructed independent of each other, further compounding the number of additional mask layers needed to form both types of devices in an integrated circuit device.

There is a need to build integrated capacitors and resistors, in particular to construct MIM capacitor modules and TFR modules together, efficiently and at reduced cost as compared with conventional processes.

SUMMARY

The present disclosure provides an integrated circuit (IC) structure including both an MIM capacitor module and a TFR module formed concurrently in a dielectric region between two metal layers in the IC structure, e.g., an inter-metal dielectric (IMD) region or a pre-metal dielectric (PMD) region. In some examples, the IC structure also includes at least one interconnect structure formed in the dielectric region between the two metal layers in the IC structure, concurrently with the MIM capacitor module and the TFR module.

As used herein, a structure formed "between" two metal layers (e.g., an MIM capacitor module, TFR module, and/or interconnect structure formed between two layers, as disclosed herein) refers to a structure including (a) at least one component formed in a dielectric region between two metal layers and (b) at least one component formed in one or both of the two metal layers.

One aspect provides an integrated circuit structure including an MIM capacitor module and a TFR module. The MIM capacitor module includes a bottom electrode base formed in a lower metal layer, a bottom electrode formed in a dielectric region between the lower metal layer and an upper metal layer, an insulator formed over the bottom electrode, and a top electrode formed in the upper metal layer over the insulator. The bottom electrode includes a cup-shaped bottom electrode component, and a bottom electrode fill component formed in an interior opening defined by the cup-shaped bottom electrode component. The TFR module includes a pair of metal heads formed in the dielectric region between the lower metal layer and the upper metal layer, and a resistor element connected across the pair of metal heads. Each metal head of the pair of metal heads includes a cup-shaped head component, and a head fill component formed in an interior opening defined by the cup-shaped head component.

In one example, the TFR module includes a pair of head bases formed in the lower metal layer, wherein each metal head is conductively connected to a respective head base.

In one example, the cup-shaped head component of each metal head and the cup-shaped bottom electrode component are formed from a conformal metal, and the head fill component of each metal head and the bottom electrode fill component are formed from a fill metal different than the conformal metal. In one example, the conformal metal comprises tungsten, and the fill metal comprises titanium nitride.

In one example, the insulator has a uniform vertical thickness across a full lateral width of the insulator.

In one example, the insulator is formed over a planarized support surface including a planarized top surface of the cup-shaped bottom electrode component and a planarized top surface of the bottom electrode fill component.

In one example, the insulator is formed on a planarized support surface including (a) a planarized top surface of the cup-shaped bottom electrode component, (b) a planarized top surface of the bottom electrode fill component, and (c) planarized top surface areas of the dielectric region on opposite sides of the bottom electrode, and the insulator extends laterally across and beyond a full width of the bottom electrode, such that the insulator extends over the planarized top surface areas of the dielectric region on opposite sides of the bottom electrode.

In one example, the thin-film resistor module includes a resistor element insulator cap element formed on the resistor element, and the resistor element insulator cap element is formed from a common insulator material as the insulator.

In one example, the lower metal layer comprises a lower interconnect layer, and the upper metal layer comprises an upper interconnect layer. In another example, the lower metal layer comprises a silicided polysilicon layer, wherein the bottom electrode base formed in the lower metal layer comprises a metal silicide region formed on a polysilicon region, and the upper metal layer comprises a first metal interconnect layer.

In one example, the metal-insulator-metal capacitor module includes a bottom electrode connection element formed in the upper metal layer, and a bottom electrode contact formed in the dielectric region between the lower metal layer and the upper metal layer. The bottom electrode contact provides a conductive connection between the bottom electrode connection element formed in the upper metal layer and the bottom electrode base formed in the lower metal layer.

In some examples, the integrated circuit structure includes an interconnect structure including a lower interconnect element formed in the lower metal layer, and an upper interconnect contact formed in the upper metal layer and connected to the lower interconnect element by at least one interconnect via. In one example, the at least one interconnect via and the cup-shaped bottom electrode component are formed from a common conformal metal.

Another aspect provides a method of forming an integrated circuit structure. The method includes forming a lower metal layer including a bottom electrode base, depositing a dielectric region over the lower metal layer, patterning and etching the dielectric region to form a bottom electrode tub opening and a pair of head tub openings, and forming a bottom electrode in the bottom electrode tub opening, wherein the bottom electrode includes a cup-shaped bottom electrode component and a bottom electrode fill component in an interior opening defined by the cup-shaped bottom electrode component. The method also includes forming a metal head in each of the pair of head tub openings, wherein each metal head includes a cup-shaped head component and a head fill component in an interior opening defined by the cup-shaped head component. The method also includes forming an insulator over the bottom electrode, forming a resistor element connected across the pair of metal heads, and forming an upper metal layer including a top electrode over the insulator.

In one example, the method includes performing a planarization process to define a planarized support surface including a planarized top surface of the cup-shaped bottom electrode component and a planarized top surface of the bottom electrode fill component, and forming the insulator over the planarized support surface.

In one example, the method includes forming the insulator with a uniform vertical thickness across a full lateral width of the insulator.

In one example, the method includes performing a planarization process to define a planarized support surface including (a) a planarized top surface of the cup-shaped bottom electrode component, (b) a planarized top surface of the bottom electrode fill component, and (c) planarized top surface areas of the dielectric region on opposite sides of the bottom electrode. The insulator extends laterally across and beyond a full width of the bottom electrode, such that the insulator extends over the planarized top surface areas of the dielectric region on opposite sides of the bottom electrode.

Another aspect provides a method of forming an integrated circuit structure. The method includes forming a lower metal layer including a bottom electrode base and a pair of head bases, forming a dielectric region over the lower metal layer, forming openings in the dielectric region, including (a) a bottom electrode opening and (b) a pair of head openings, depositing a conformal metal extending into the bottom electrode opening and into each head opening, and depositing a fill metal over the conformal metal layer and extending into the electrode opening and into each head opening. The method also includes performing a planarization process to remove portions of both the conformal metal and the fill metal, wherein (a) remaining portions of the conformal metal and fill metal in the bottom electrode opening define a bottom electrode including (i) a cup-shaped bottom electrode component and (ii) a bottom electrode fill component in an interior opening defined by the cup-shaped bottom electrode component, and (b) remaining portions of the conformal metal and fill metal in each of the pair of head openings define a pair of metal heads, each metal head including (i) a cup-shaped head component and (ii) a head fill component in an interior opening defined by the cup-shaped head component. The method also includes forming an insulator over the bottom electrode, forming a resistor element spanning the pair of metal heads, and forming an upper metal layer including a top electrode over the insulator.

In one example, the method includes forming the insulator with a uniform vertical thickness across a full lateral width of the insulator.

In one example, the planarization process defines a planarized support surface including a planarized top surface of the cup-shaped bottom electrode component and a planarized top surface of the bottom electrode fill component, and the insulator is formed on the planarized support surface.

In one example, the planarization process defines a planarized support surface including (a) a planarized top surface of the cup-shaped bottom electrode component, (b) a planarized top surface of the bottom electrode fill component, and (c) planarized top surface areas of the dielectric region on opposite sides of the bottom electrode. The insulator extends laterally across and beyond a full width of the bottom electrode, such that the insulator extends over the planarized top surface areas of the dielectric region on opposite sides of the bottom electrode.

In one example, the method includes forming an insulator layer over the bottom electrode and over the pair of metal heads, and etching the insulator layer to form (a) the insulator over the bottom electrode and (b) an insulator cap element over the resistor element.

In one example, forming the upper metal layer includes forming (a) the top electrode over the insulator and (b) a metal cap element over the insulator cap element.

In one example, the method includes depositing a resistor film over the bottom electrode and over the pair of metal heads, depositing an insulator layer over the resistor film, and after depositing an insulator layer over the resistor film, patterning and etching the resistor film and the insulator layer. Remaining portions of the resistor film define (a) a resistor film region over the bottom electrode and (b) the resistor element spanning the pair of metal heads, and remaining portions of the insulator layer define (a) the insulator over the bottom electrode and (b) an insulator cap element over the resistor element.

In one example, the lower metal layer comprises a lower interconnect layer, and the upper metal layer comprises an upper interconnect layer.

In one example, the lower metal layer comprises a silicided polysilicon layer, wherein each of (a) the bottom electrode base and (b) each head base comprises a metal silicide region formed on a respective polysilicon region, and the upper metal layer comprises a first metal interconnect layer.

In one example, the method includes forming an interconnect via opening in the dielectric region, and depositing the conformal metal into the interconnect via opening, wherein a portion of the conformal metal in the interconnect via opening after the planarization process defines an interconnect via, and wherein the interconnect via conductively connects a lower interconnect element formed in the lower metal layer to an upper interconnect element formed in the upper metal layer.

BRIEF DESCRIPTION OF THE DRAWINGS

Example aspects of the present disclosure are described below in conjunction with the figures, in which.

Figure 1A:
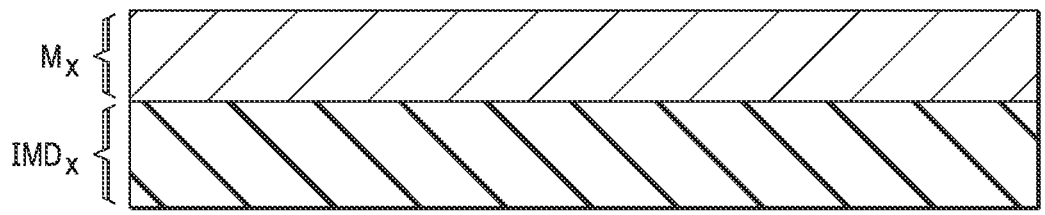
FIGS. 1A-1F are cross-sectional side views showing an example prior art process for forming an example MIM capacitor module.
Figure 1B:
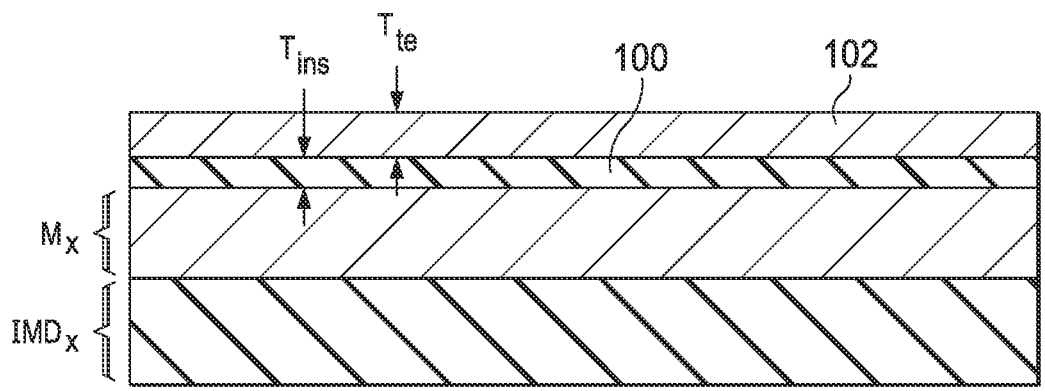
Figure 1C:
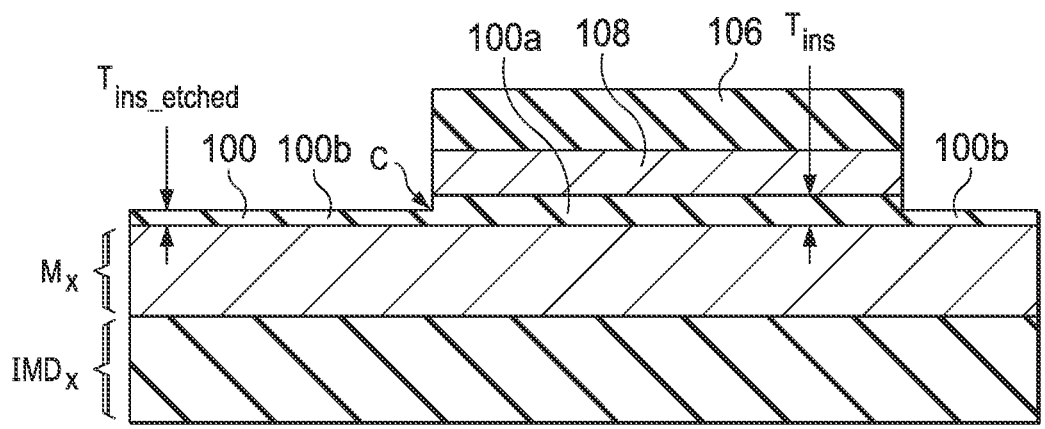
Figure 1D:
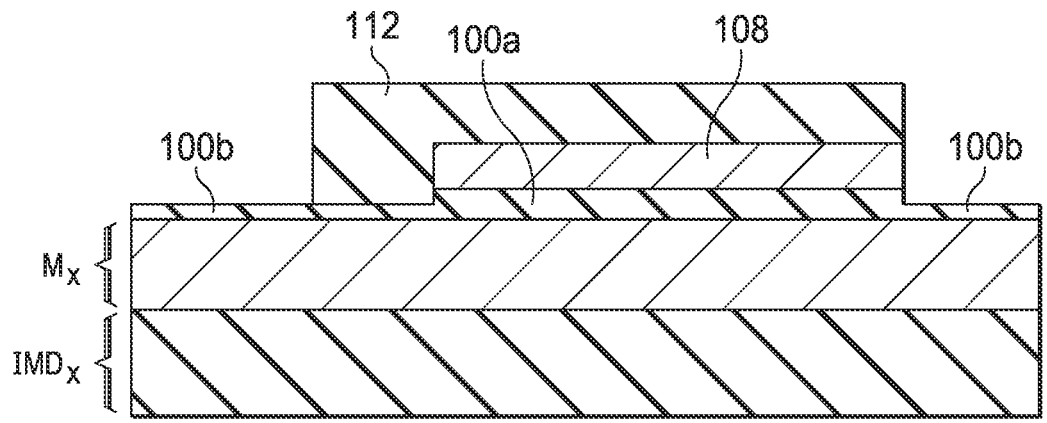
Figure 1E:
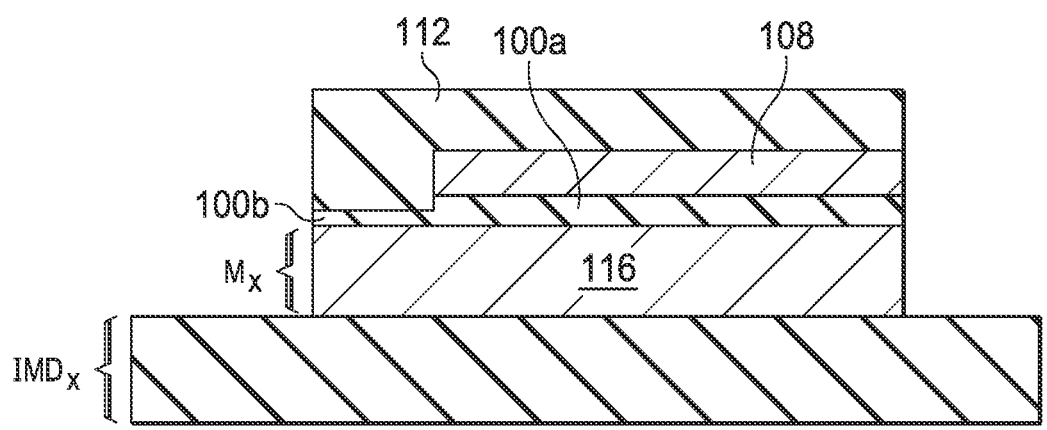

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides an integrated circuit (IC) structure including both an MIM capacitor module and a TFR module formed in a dielectric region between two metal layers in the IC structure, e.g., an inter-metal dielectric (IMD) region or a pre-metal dielectric (PMD) region.

The MIM capacitor module includes (a) a bottom electrode base formed in a lower metal layer $M_x$, (b) a bottom electrode conductively coupled to the bottom electrode base, (c) an insulator formed over the bottom electrode, and (d) a top electrode formed in an upper metal layer $M_{x+1}$ over the insulator. The MIM capacitor module may also include (e) a bottom electrode connection element formed in the upper metal layer $M_{x+1}$, and (f) a bottom electrode contact conductively connecting the bottom electrode connection element to the bottom electrode base.

The TFR module includes (a) a pair of head bases formed in the lower metal layer $M_x$, (b) a pair of metal heads, each conductively connected to one of the head bases, and (c) a resistor element spanning across and conductively connected to the pair of metal heads. The TFR module may also include a resistor element insulator cap element over the resistor element, and a metal cap element over the resistor element insulator cap element, wherein the resistor element insulator cap element is formed from a common resistor film as the insulator of the MIM capacitor module and the metal cap element is formed in the same upper metal layer $M_{x+1}$ as the top electrode and bottom electrode contact of the MIM capacitor module.

Thus, the bottom electrode of the MIM capacitor module and each metal head of the TFR module are formed between the lower metal layer $M_x$ and upper metal layer $M_{x+1}$. In addition, the bottom electrode and each metal head may be formed as a multi-component structure using a damascene process. The bottom electrode of the MIM capacitor module may include a cup-shaped bottom electrode component and a bottom electrode fill component formed in an interior opening defined by the cup-shaped bottom electrode component. Similarly, each metal head of the TFR module may include a cup-shaped head component and a head fill component formed in an interior opening defined by the cup-shaped head component. The cup-shaped bottom electrode component of the bottom electrode, and the cup-shaped head component of each metal head of the TFR module, may be formed from a common conformal metal, e.g., tungsten. The bottom electrode fill component of the bottom electrode, and the head fill component of each metal head of the TFR module, may be formed from a fill metal, e.g., titanium nitride.

The insulator of the MIM capacitor module may be formed on a planarized support surface (e.g., including a planarized upper surface of the bottom electrode). The insulator may have a uniform thickness across a full lateral width of the insulator, which may provide an improved capacitor breakdown voltage as compared with certain conventional capacitor modules. In addition, by forming the bottom electrode from refractory metals, e.g., tungsten and titanium nitride, the top surface of the bottom electrode that interfaces the insulator may be free of hillocks that are common in certain conventional capacitors (e.g., capacitor modules using an aluminum bottom electrode), which may provide a higher and more consistent capacitor breakdown voltage as compared with such conventional capacitor modules. Also, the top electrode and the bottom electrode may each have a substantial thickness, e.g., a thickness of at least 4000 Å, which may provide improved performance in particular applications (e.g., RF applications) as compared with certain conventional capacitor modules having a thinner top electrode and/or bottom electrode.

As mentioned above, the MIM capacitor module and TFR module are formed between two metal layers, in particular the lower metal layer $M_x$ (in which the bottom electrode base of the MIM capacitor, and the pair of head bases of the TFR module, are formed) and an upper metal layer $M_{x+1}$ (in which the top electrode and bottom electrode connection element of the MIM capacitor module, and the metal cap element over the resistor element of the TFR module, are formed). As used herein, a "metal layer," for example in the context of the lower metal layer $M_x$ and upper metal layer $M_{x+1}$, may comprise any metal or metalized layer or layers, including:

(a) a metal interconnect layer, e.g., comprising aluminum, copper, or other metal formed by a damascene process or deposited by a subtractive patterning process (e.g., deposition, patterning, and etching of a metal layer), or (b) a silicided polysilicon layer including a number of silicided polysilicon structures (i.e., polysilicon structures having a metal silicide layer formed thereon), for example a silicided polysilicon gate of a metal-oxide-semiconductor field-effect transistor (MOSFET).

Figure 3A:
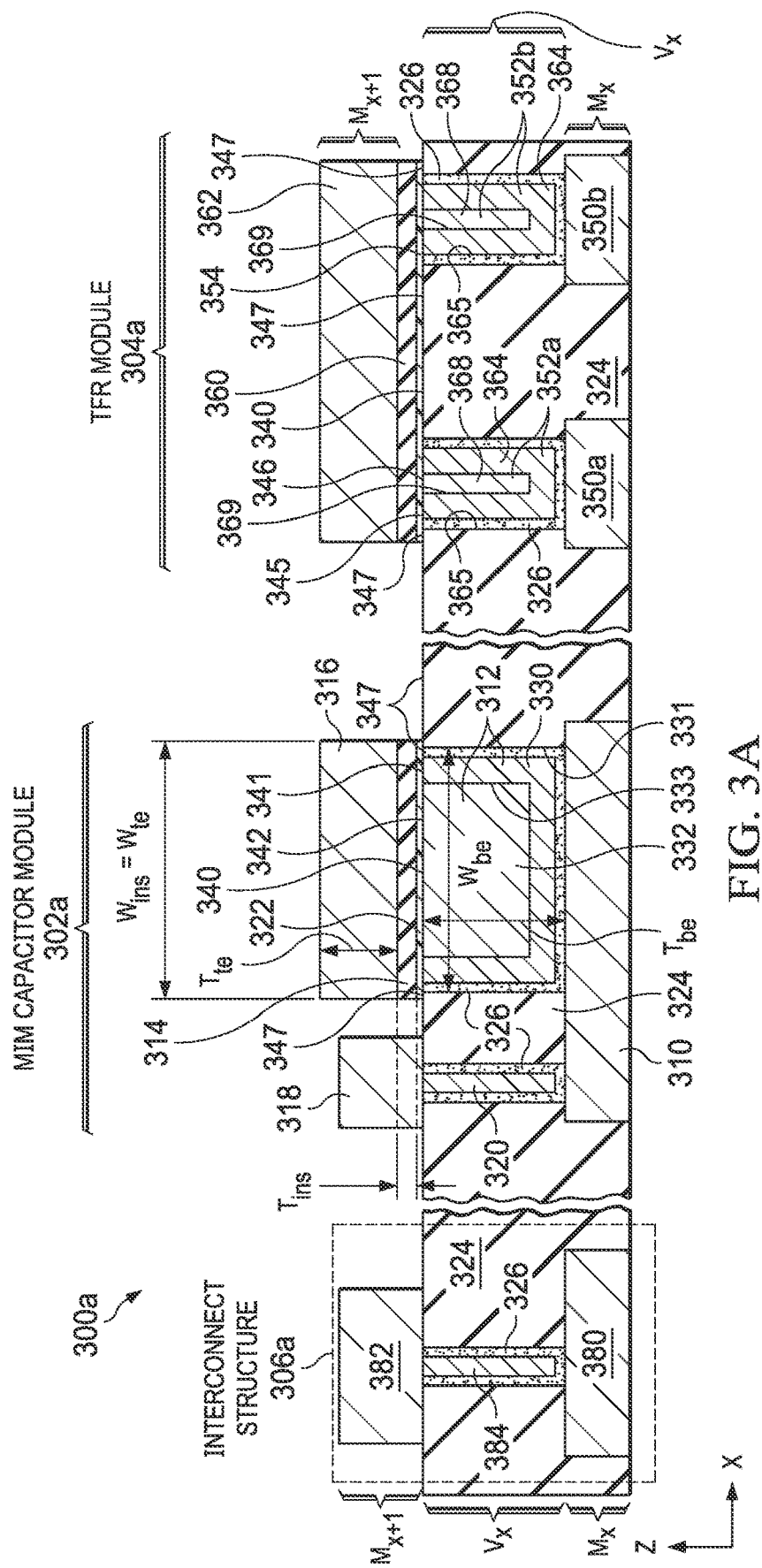
FIG. 3A is a cross-sectional side view an example integrated structure including an example MIM capacitor module, TFR module, and interconnect structure formed between two metal interconnect layers in an integrated circuit structure, according to one example.
Figure 3B:
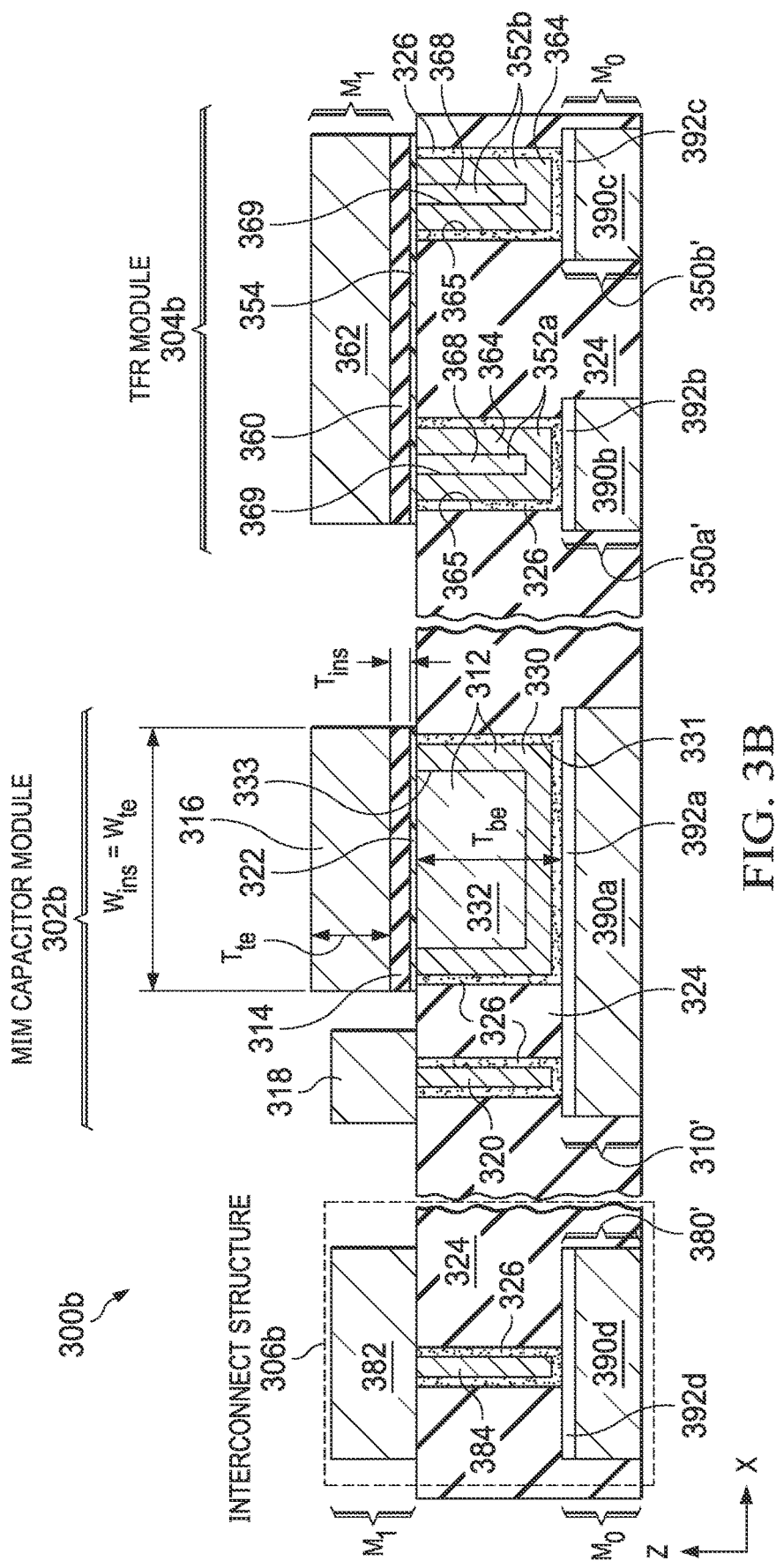
FIG. 3B is a cross-sectional side view an example integrated structure including an example MIM capacitor module, TFR module, and interconnect structure formed between a silicided polysilicon layer and a first metal interconnect layer in an integrated circuit structure, according to one example.

For example, as shown in FIG. 3A, an MIM capacitor module and TFR module may be constructed between two adjacent metal interconnect layers $M_x$ and $M_{x+1}$ at any depth in an integrated circuit structure. As another example, as shown in FIG. 3B, an MIM capacitor module and TFR module may be constructed between a silicided polysilicon layer and a first metal interconnect layer (commonly referred to as the metal-1 layer), wherein the silicided polysilicon layer defines the lower metal layer $M_x$ where x=0 (i.e., $M_0$) and the first metal interconnect layer (Metal-1 layer) defines the upper metal layer $M_{x+1}$ (i.e., $M_1$).

FIG. 3A is a cross-sectional side view an example integrated circuit structure 300a including an example MIM capacitor module 302a, an example TFR module 304a, and (optionally) an example interconnect structure 306a, all formed between two metal interconnect layers $M_x$ and $M_{x+1}$, according to some examples. In some examples, integrated circuit structure 300a includes the MIM capacitor module 302a, TFR module 304a, and interconnect structure 306a. In other examples, integrated circuit structure 300a includes the MIM capacitor module 302a and TFR module 304a, but not the interconnect structure 306a. Thus, the optional interconnect structure 306a is indicated in FIG. 3A with a dashed line.

The example MIM capacitor module 300a includes (a) a bottom electrode base 310 formed in a lower metal interconnect layer $M_x$, (b) a bottom electrode 312 conductively coupled to the bottom electrode base 310, (c) an insulator 314 formed over the bottom electrode 312, and (d) a top electrode 316 formed in an upper metal interconnect layer $M_{x+1}$ over the insulator 314. A resistor film region 322 may be arranged between the insulator 314 and underlying bottom electrode 312. The MIM capacitor module 302a also includes a bottom electrode connection element 318 formed in the upper metal interconnect layer $M_{x+1}$, and a bottom electrode contact 320 conductively connecting the bottom electrode connection element 318 to the bottom electrode base 310.

The bottom electrode 312 is formed in a dielectric region 324 formed in a via layer $V_x$ between the metal interconnect layer $M_x$ and upper metal interconnect layer $M_{x+1}$. The bottom electrode 312 may be formed using a damascene process, as described below. In the illustrated example, the bottom electrode 312 includes (a) a cup-shaped bottom electrode component 330 formed in a tub opening 331 formed in the dielectric region 324 and (b) a bottom electrode fill component 332 formed in an interior opening 333 defined by the cup-shaped bottom electrode component 330.

In some examples, the bottom electrode contact 320 is formed as a via, and may also be referred to as a bottom electrode via.

In some examples, the insulator 314 may be formed over a planarized support surface 340. For example, as shown in FIG. 3A, the insulator 314 may be formed on the resistor film region 322 formed on the planarized support surface 340. The planarized support surface 340, which may be formed by a chemical mechanical planarization (CMP) or other planarization process, includes (a) a planarized top surface 341 of the cup-shaped bottom electrode component 330, (b) a planarized top surface 342 of the bottom electrode fill component 332, and (c) a planarized top surface 347 of the dielectric region 324, including top surface areas of the dielectric region 324 on opposite lateral sides (in the x-direction, or in both the x-direction and y-direction) of each of the bottom electrode 312.

Figure 1F:
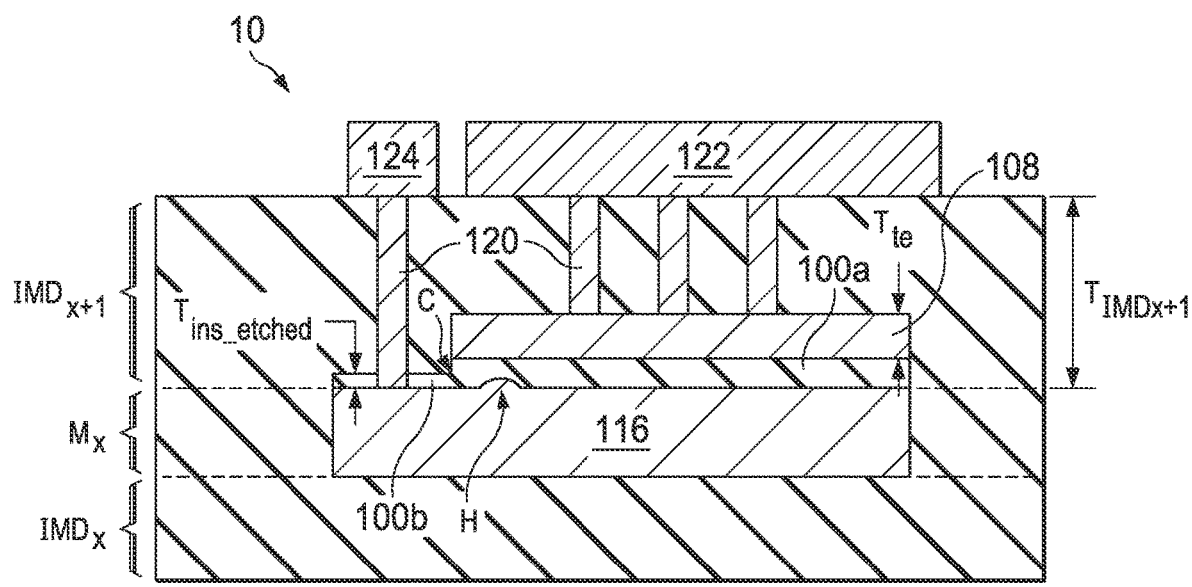

The planarized support surface 340 may free of metal hillocks, as the bottom electrode 312 is formed from refractory metals (e.g., tungsten and titanium nitride) which resist the formation of hillocks, unlike the aluminum bottom electrode of the example prior art MIM capacitor module 10 shown in FIG. 1F discussed above. Forming the insulator 314 on a surface free of hillocks may provide a higher and more consistent capacitor breakdown voltage, e.g., as compared with a conventional capacitor module having a bottom electrode including hillocks.

The surface roughness of the planarized support surface 340 may depend on the specific process parameters implemented (e.g., CMP process parameters). In some examples, the planarized support surface 340 has a root-mean-square (RMS) surface roughness of less than 50 Å. In some examples, the planarized support surface 340 has an RMS surface roughness of less than 20 Å.

Figure 13:
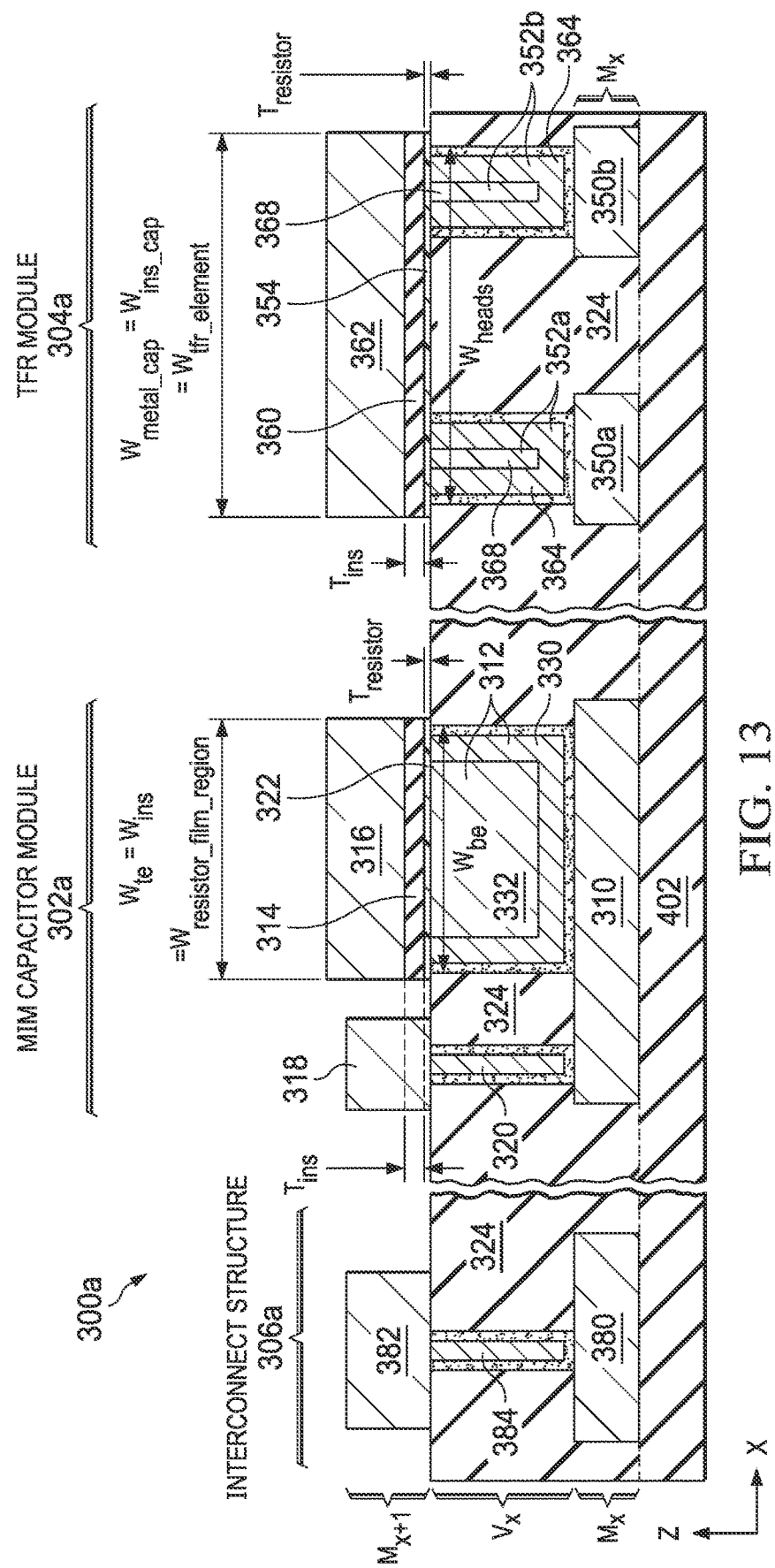

As mentioned above, insulator 314 may be formed on resistor film region 322 formed on the planarized support surface 340. The lateral width $W_{ins}$ of the insulator 314 in the x-direction may be coextensive with the lateral width $W_{te}$ of the overlying top electrode 316, as a result of an anisotropic metal etch extending through both the top electrode 316 and insulator 314, e.g., as shown in FIG. 13 discussed below.

In some examples, e.g., as shown in FIG. 3A, a lateral width $W_{te}$ of the top electrode 316 and a corresponding lateral width $W_{ins}$ of insulator 314 are greater than a lateral width $W_{be}$ of the underlying bottom electrode 312 in the x-direction, such that the insulator 314 extends across and beyond the full lateral width $W_{be}$ of the bottom electrode 312 and onto the planarized top surface areas 347 of dielectric region 324 on opposite sides of the bottom electrode 312 in the x-direction. In other words, the insulator 314 extends across the planarized top surface 341 of the cup-shaped bottom electrode component 330, the planarized top surface 342 of the bottom electrode fill component 332, and the planarized top surface areas 347 of the dielectric region 324. In some examples, the insulator 314 extends laterally across the full lateral width $W_{be}$ of the bottom electrode 312 in both the x-direction and y-direction, and additionally extends over portions of the dielectric region 324 on all lateral sides of the bottom electrode 312, such that a perimeter of the insulator 314 surrounds a perimeter of the bottom electrode 312, from a top view.

The insulator 314 has a uniform thickness $T_{ins}$ across the full lateral width $W_{ins}$ of the insulator 314. For example, in some examples the thickness $T_{ins}$ of the insulator 314 varies by less than 10% across the full lateral width $W_{ins}$ of the insulator 314. In some implementations the thickness $T_{ins}$ of the insulator 314 varies by less than 5%, or even less than 1%, across the full lateral width $W_{ins}$ of the insulator 314.

This uniform thickness $T_{ins}$ across the full lateral width $W_{ins}$ of the insulator 314 may provide an increased and predictable breakdown voltage for the resulting MIM capacitor module 302a, e.g., as compared with a capacitor module having a partially etched thickness or otherwise varying thickness, e.g., the prior art MIM capacitor module 10 shown in FIG. 1F and discussed above.

Further, by forming the bottom electrode 312 between two metal layers $M_x$ and $M_{x+1}$ the bottom electrode 312 may have a thickness $T_{be}$ extending across the full thickness of the dielectric region 324 between the metal layers $M_x$ and $M_{x+1}$. In addition, by forming the top electrode 316 from the metal interconnect layer $M_{x+1}$, the top electrode 316 may have a thickness $T_{te}$ defined by the thickness of the metal interconnect layer $M_{x+1}$. Thus, the bottom electrode thickness $T_{be}$ and top electrode thickness $T_{te}$ may be sufficient to provide target performance characteristics for various applications (e.g., including RF applications), as compared with certain conventional capacitor modules having a thinner top electrode and/or bottom electrode. In some examples, the bottom electrode thickness $T_{be}$ may be at least 4000 Å, and the top electrode thickness $T_{te}$ may be at least 4000 Å.

Next, as shown in FIG. 3A, the example TFR module 304a includes (a) a pair of head bases 350a and 350b formed in the lower metal interconnect layer $M_x$, (b) a pair of metal heads 352a and 352b, each conductively coupled to a respective head base 350a, 350b, and (c) a resistor element 354 connected across the pair of metal heads 352a and 352b. The example TFR module 304a also includes (a) an insulator cap element 360 (formed from an insulator layer used to form the insulator 314 of the MIM capacitor module 302a), and (b) a metal resistor cap element 362 formed in the upper metal interconnect layer $M_{x+1}$ over the insulator cap element 360.

Metal heads 352a and 352b are formed in the via layer $V_x$ between the lower metal interconnect layer $M_x$ and upper metal interconnect layer $M_{x+1}$, e.g., using a damascene process. For example, each metal head 352a and 352b may include (a) a cup-shaped head component 364 formed in a head opening 365 formed in the dielectric region 324 and (b) a head fill component 368 formed in an interior opening 369 defined by the cup-shaped head component 364.

The resistor element 354 is formed on the polished, planarized support surface 340. For example, as shown in FIG. 3A, the resistor element 354 may be formed on a portion of the planarized support surface 340 including (a) a planarized top surface 345 of each cup-shaped head component 364, (b) a planarized top surface 346 of each head fill component 368, and (c) a planarized top surface areas 347 of the dielectric region 324 laterally between and adjacent the pair of metal heads 352a and 352b.

The resistor element 354 of the TFR module 304a may be formed from a common resistor film as the resistor film region 322 formed between the insulator 314 and underlying bottom electrode 312 of the MIM capacitor module 302a, as described below. Further, the insulator cap element 360 of the TFR module 304a may be formed from a common insulator layer as the insulator 314 of the MIM capacitor module 302a, as described below.

The (optional) interconnect structure 306a includes a lower interconnect element 380 formed in the lower metal interconnect layer $M_x$, an upper interconnect contact 382 formed in the upper metal interconnect layer $M_{x+1}$, and an interconnect via 384 formed in the via layer $V_x$ and conductively connected between the lower interconnect element 380 and upper interconnect contact 382.

The cup-shaped bottom electrode component 330 of the bottom electrode 312, the cup-shaped head component 364 of each metal head 352a, 352b, the bottom electrode contact 320, and the interconnect via 384 may be formed from a conformal metal, e.g., tungsten. In some examples, the cup-shaped bottom electrode component 330, the cup-shaped head components 364 of metal heads 352a and 352b, the bottom electrode contact 320, and the interconnect via 384 may be formed simultaneously by deposition of tungsten or other conformal metal, as discussed below with reference to FIG. 6. In some examples, an adhesive layer 326 (e.g., a TiN layer with a thickness in the range of 50-300 Å) is deposited prior to deposition of the conformal metal to improve adhesion between the conformal metal and surrounding areas of the dielectric region 324, in particular in the tub opening 331 and head openings 365.

The bottom electrode fill component 332 of the bottom electrode 312, and the head fill component 368 of each metal head 352a, 352b may be formed from a "fill metal" that may be different than the conformal metal that forms the cup-shaped bottom electrode component 330, each cup-shaped head component 364, the bottom electrode contact 320, and the interconnect via 384. For example, the fill metal forming the bottom electrode fill component 332 and each head fill component 368 may comprise TiN or other refractory metal different than the conformal metal. In some examples, the bottom electrode fill component 332 and the head fill components 368 may be formed simultaneously by deposition of the fill metal, as discussed below with reference to FIG. 7.

Figure 2:
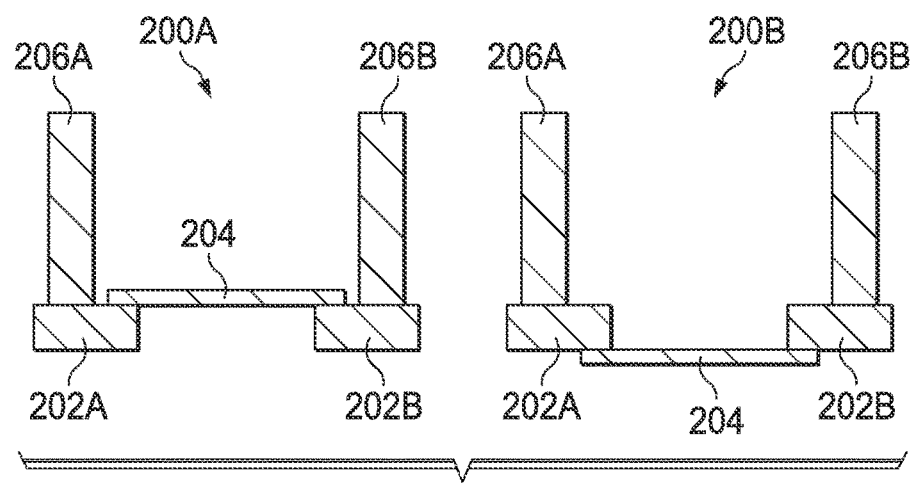
FIG. 2 is a cross-sectional view of two example prior art thin-film resistors (TFR)

The example TFR module 304a shown in FIG. 3A may include various advantages or improvements over certain conventional designs, e.g., the example prior art TFR designs shown in FIG. 2. First, the construction of TFR module 304a may be simplified, as compared with conventional methods. For example, the TFR module 304a may be constructed using only a single added mask added to the relevant background IC fabrication process. In addition, the metal heads 352a, 352b of the TFR module 304a may be built concurrently with the bottom electrode 312 of the MIM capacitor module 302a and/or interconnect via 384. The metal heads 352a, 352b may be formed with a relatively large contact areas and low resistance.

FIG. 3B is a cross-sectional side view an example integrated circuit structure 300b including an example MIM capacitor module 302b, an example TFR module 304b, and (optionally) an example interconnect structure 306b, all formed between a silicided polysilicon layer and a first metal interconnect layer (commonly referred to as the metal-1 layer), according to one example. In this example, the silicided polysilicon layer defines a lower metal layer $M_0$ (i.e., lower metal layer $M_x$ where x=0) and the first metal interconnect layer (Metal-1) defines an upper metal layer $M_1$.

Integrated circuit structure 300b is similar to integrated circuit structure 300a shown in FIG. 3A and discussed above, with the exception that the illustrated structures of integrated circuit structure 300b (MIM capacitor module 302b, TFR module 304b, and optional interconnect structure 306b) are formed between the silicided polysilicon layer $M_0$ and first metal interconnect layer $M_1$, rather than between two metal interconnect layers $M_x$ and $M_{x+1}$.

In some examples, integrated circuit structure 300b includes the MIM capacitor module 302b, TFR module 304b, and interconnect structure 306b. In other examples, integrated circuit structure 300b includes the MIM capacitor module 302b and TFR module 304b, but not the interconnect structure 306b. Thus, the optional interconnect structure 306b is indicated in FIG. 3B with a dashed line.

As shown in FIG. 3B, a bottom electrode base 310' of the MIM capacitor module 300b, a pair of head bases 350a' and 350b' of the TFR module 304b, and a lower interconnect element 380' of the interconnect structure 306b are each formed as a silicided polysilicon structure including a metal silicide layer formed on a respective polysilicon structure in the silicided polysilicon layer $M_0$. More particularly, bottom electrode base 310' comprises a metal silicide layer 392a formed on a top surface of a polysilicon structure 390a; head base 350a' comprises a metal silicide layer 392b formed on a top surface of a polysilicon structure 390b; head base 350b' comprises a metal silicide layer 392c formed on a top surface of a polysilicon structure 390c; and lower interconnect element 380' comprises a metal silicide layer 392d formed on a top surface of a polysilicon structure 390d. Metal silicide layers 392a-392d may comprise any suitable metal silicide layer, for example titanium silicide (TiSi2), cobalt silicide (CoSi2), or nickel silicide (NiSi), having a thickness in the range of 100-300 Å or other suitable thickness.

FIGS. 4-13 are cross-sectional side views showing an example process for forming the example integrated circuit structure 300a shown in FIG. 3A, including the example MIM capacitor module 302a, the example TFR module 304a, and the example interconnect structure 306a, according to one example.

Figure 4:
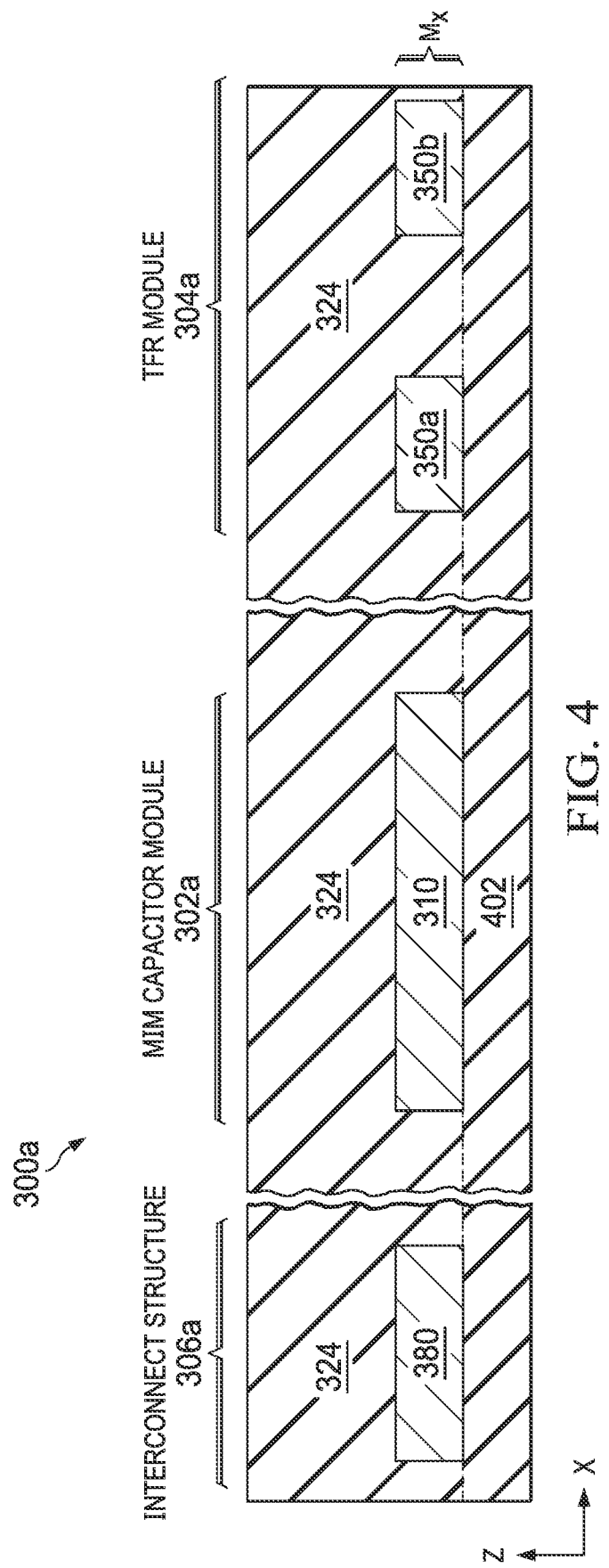
FIGS. 4-13 are cross-sectional side views showing an example process of forming an integrated circuit structure including the example MIM capacitor module, TFR module and interconnect structure shown in FIG. 3A along with an example interconnect structure.

First, as shown in FIG. 4, a lower metal interconnect layer $M_x$ is formed over a dielectric region 402, e.g., a pre-metal dielectric (PMD) region or inter-metal dielectric (IMD) region. Metal layer $M_x$ may be formed from aluminum, copper, or other suitable metal. Metal layer $M_x$ may be deposited, patterned, and etched to form (a) the bottom electrode base 310 of the MIM capacitor module 302a, (b) the pair of head bases 350a and 350b of the TFR module 304a, and (c) the lower interconnect element 380 of the interconnect structure 306a. Alternatively, the bottom electrode base 310, head bases 350a and 350b, and lower interconnect element 380 may be formed by a damascene process. Each of the bottom electrode base 310, head bases 350a and 350b, and lower interconnect element 380 may comprise a wire or other laterally elongated structure (e.g., elongated in the y-axis direction), or a discrete pad (e.g., having a square, circular, or substantially square or circular shape in the x-y plane), or any other suitable shape and structure.

A resist strip may be performed to remove remaining portions of the photomask used for patterning the metal layer $M_x$. A dielectric region 324 may be formed over metal layer $M_x$, e.g., by performing an oxide deposition (e.g., using high density plasma (HDP) and PECVD processes) followed by a CMP process to planarize the oxide. Dielectric region 324 may be an inter-metal dielectric (IMD) region.

Figure 5B:
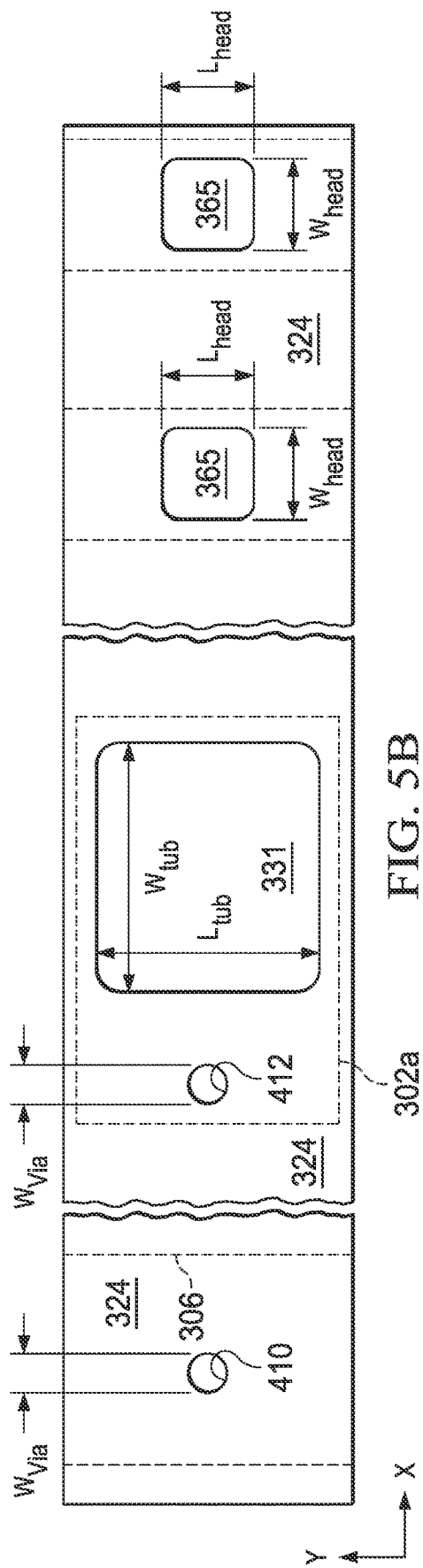
Figure 5A:
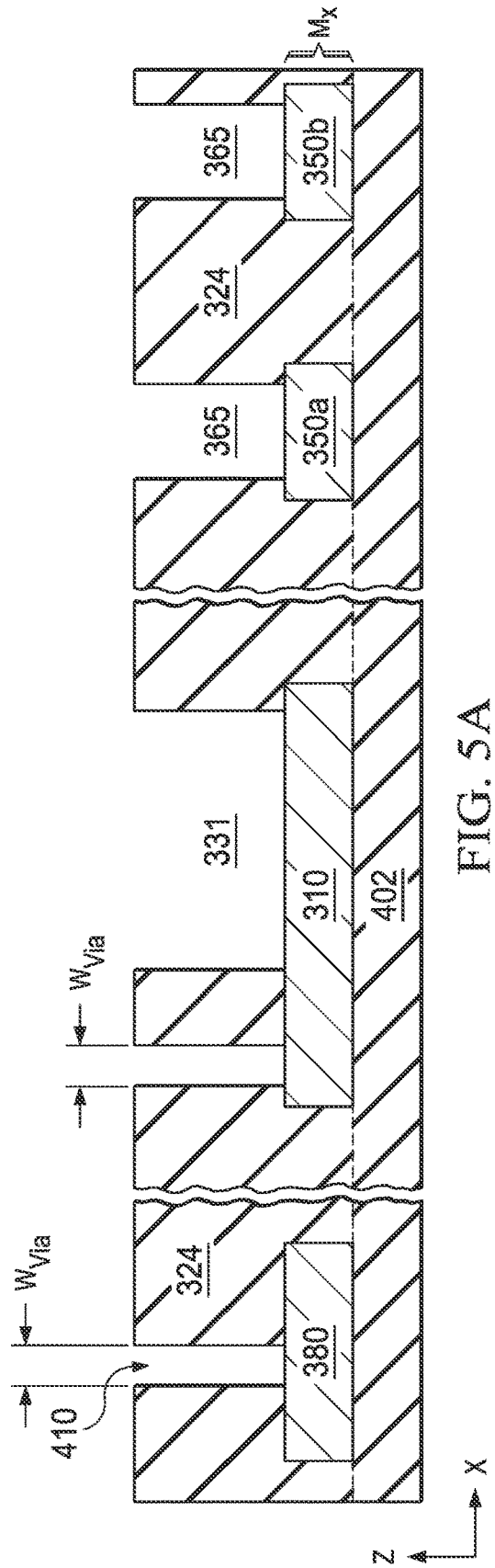

Next, as shown in FIG. 5A (cross-sectional side view) and corresponding FIG. 5B (top view), the dielectric region 324 is patterned and etched (e.g., using a plasma etch) to concurrently form (a) at least one interconnect via opening 410 for various interconnect structures, (b) a bottom electrode contact opening 412, (c) the tub opening 331 for forming the bottom electrode 312 of the MIM capacitor module 302a, and (d) the pair of head openings 365 for forming the pair of metal heads 352a and 352b of the TFR module 304a.

The interconnect via opening 410 and bottom electrode contact opening 412 may each be formed as a narrow via opening with a lateral diameter or width $W_{via}$. In contrast, the tub opening 331 and each head opening 365 may have a substantially larger width (x-direction) and/or length (y-direction) than the narrow via openings 310 and 312. The shape and dimensions of the tub opening 331 and head openings 365 may be selected based on various parameters, e.g., for effective manufacturing of the MIM capacitor module 302a and TFR module 304a (e.g., effective deposition of the conformal metal and fill metal (e.g., tungsten and TiN, respectively) into the openings 331 and 365) and/or for desired performance characteristics of the resulting MIM capacitor module 302a and TFR module 304a. In some examples, the tub opening 331 and head openings 365 may each have a square or rectangular shape from a top view, e.g., as shown in FIG. 5B. In other examples, the tub opening 331 may have a circular or oval shape from the top view.

As noted above, an x-direction width $W_{tub}$ and/or y-direction length $L_{tub}$ of the tub opening 331 may be substantially larger than the width $W_{via}$ of each via opening. For example, in some embodiments, the width $W_{tub}$ and/or length $L_{tub}$ of the tub opening 331 is at least twice as large as the width $W_{via}$ of each via opening. In particular embodiments, the width $W_{tub}$ and/or length $L_{tub}$ of the tub opening 331 is at least five times as large, ten times as large, or 20 times as large, as the width $W_{via}$ of each via opening. In some examples, the width $W_{via}$ of each via opening is in the range of 0.1-0.5 μm, whereas the width $W_{tub}$ and length $L_{tub}$ of the tub opening 331 are each the range of 1-100 μm.

In addition, an x-direction width $W_{head}$ and/or y-direction length $L_{head}$ of each head opening 365 may be substantially larger than the width $W_{via}$ of each via opening. For example, in some embodiments, the width $W_{head}$ and/or length $L_{head}$ of the tub opening 365 is at least twice as large as the width $W_{via}$ of each via opening. In particular embodiments, the width $W_{head}$ and/or length $L_{head}$ of each head opening 365 is at least five times as large, ten times as large, or 20 times as large as the width $W_{via}$ of each via opening. In some examples, the width $W_{via}$ of each via opening is in the range of 0.1-0.5 μm, whereas the width $W_{head}$ and length $L_{head}$ of each head opening 365 are each the range of 0.5-10 μm.

After the etch to create the openings 410, 412, 331, and 365, any remaining photoresist material may be removed by a resist strip.

Figure 6:
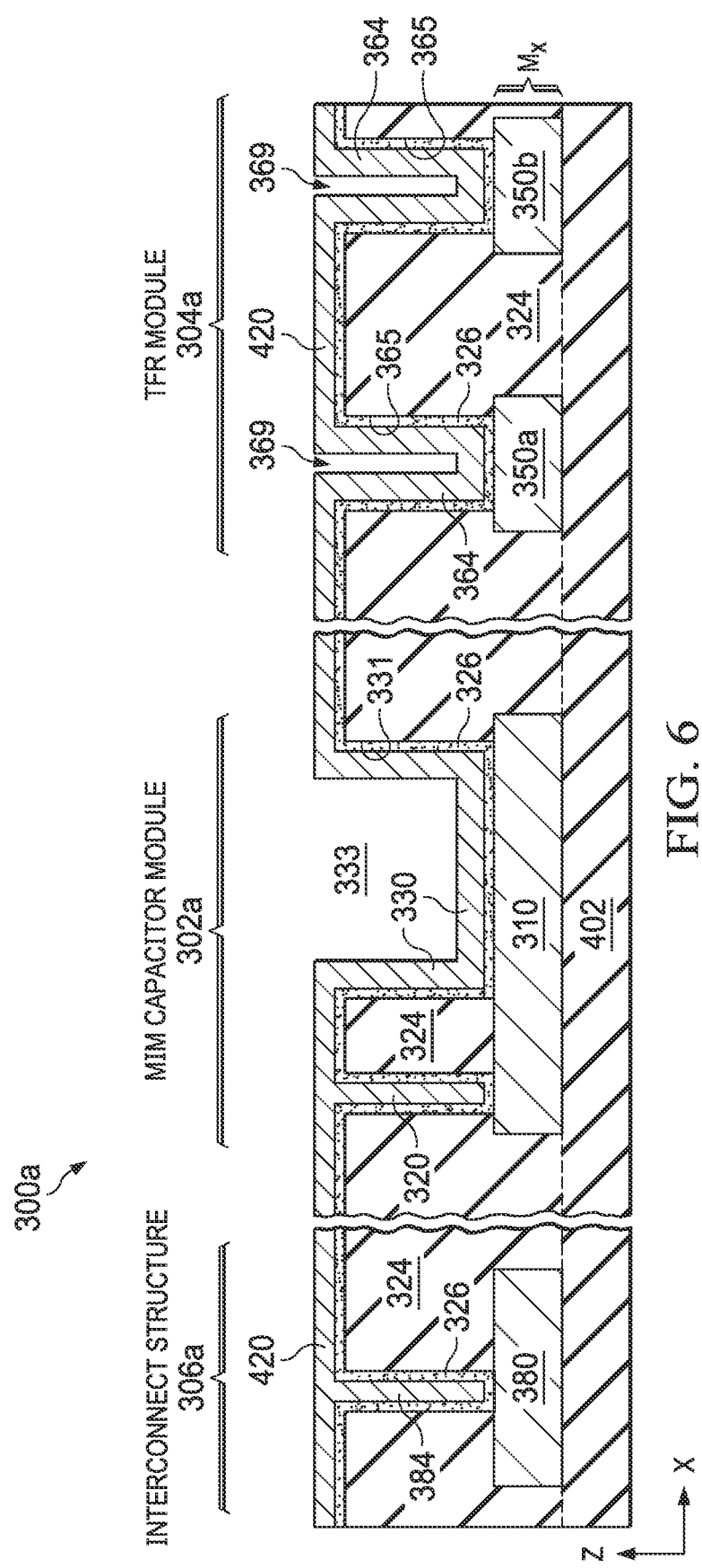

Next, as shown in FIG. 6, adhesive layer 326 (e.g., comprising titanium nitride, TiN) is deposited over the integrated circuit structure 300a and into the openings 410, 412, 331, and 365, e.g., with a thickness in the range of 50-300 Å, in one example. A conformal metal layer 420, e.g., tungsten (W), is then deposited over adhesive layer 326, e.g., by Chemical Vapor Deposition (CVD) deposition, with a thickness, in one example, in the range of 1000-5000 Å. As shown, the conformal metal layer 420 (a) fills the interconnect via opening 410 to form an interconnect via 384, (b) fills the bottom electrode contact opening 412 to form the bottom electrode contact 320, (c) partially fills the tub opening 331 to form the cup-shaped bottom electrode component 330 in the tub opening 331, and (d) partially fills each head opening 365 to form the cup-shaped head component 364 in each head opening 365. The cup-shaped bottom electrode component 330 defines an interior opening 333, and each cup-shaped head component 364 defines an interior opening 369.

The interconnect via 384, bottom electrode contact 320, cup-shaped bottom electrode component 330, and cup-shaped head components 364 are further processed as discussed below, including a CMP process shown in FIG. 8A, which defines a final form of each respective element 384, 320, and 330, and 364.

The deposited conformal metal layer 420 layer may have high tensile stresses, due to inherent material properties of the conformal metal, e.g., tungsten. As a result, a deposition thickness substantially above about 5000 Å (e.g., a thickness of 7000 Å) may result in a cracking or peeling of the conformal metal layer 420, or a warping or breakage of the underlying silicon wafer (not shown), e.g., during a subsequent CMP process. However, these dimensions are not meant to be limiting in any way.

Figure 7:
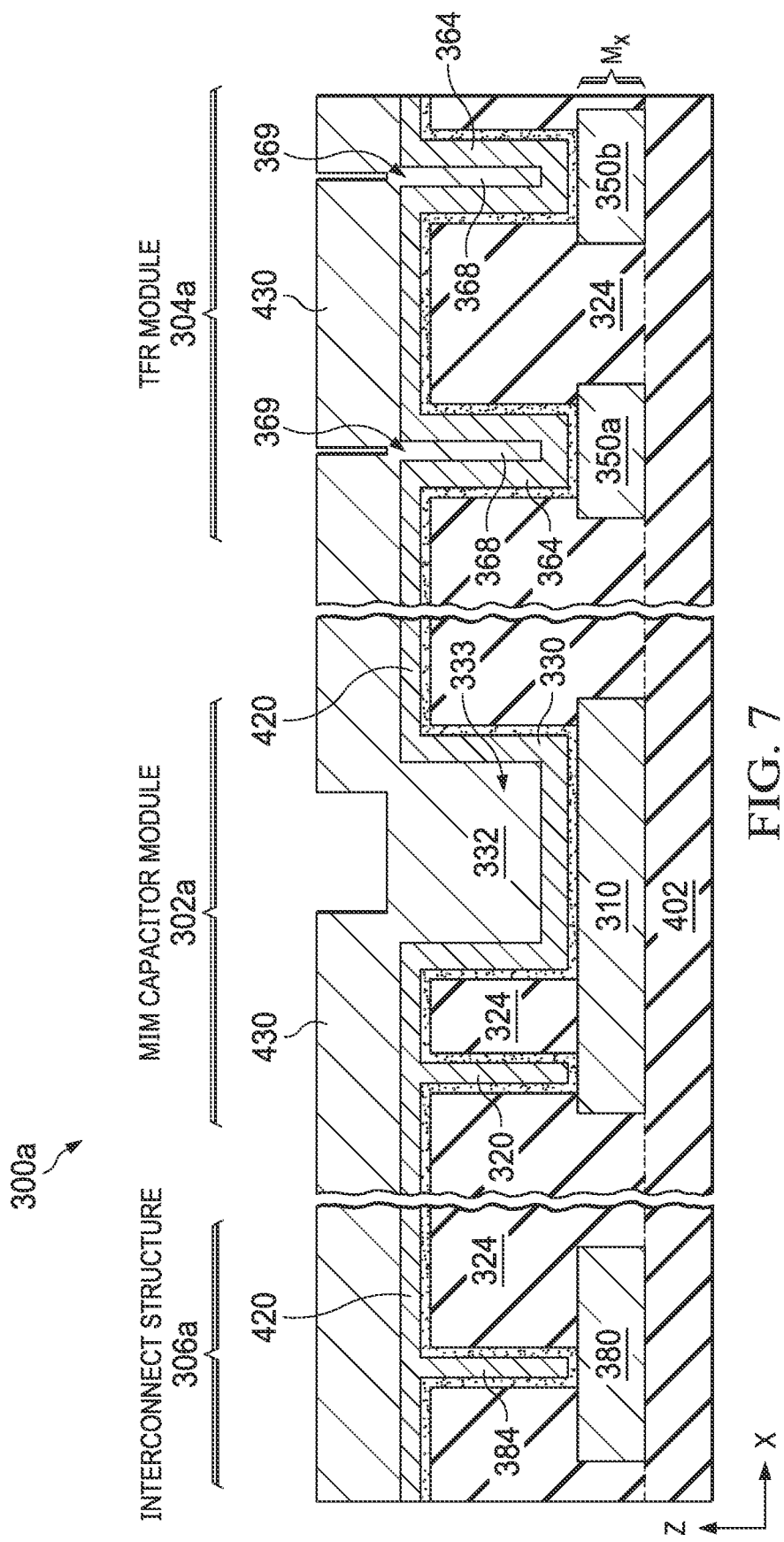

Next, as shown in FIG. 7, a fill metal layer 430 is deposited over the integrated circuit structure 300 to fill the interior opening 333 of the cup-shaped bottom electrode component 330 and the interior opening 369 of each cup-shaped head component 364. The fill metal layer 330 may deposited with sufficient thickness to fill the interior openings 333 and 369 at least to the top of the dielectric region 324. The portion of the fill metal layer 430 filling interior opening 333 of the cup-shaped bottom electrode component 330 defines the bottom electrode fill component 332, and the portion of the fill metal layer 430 filling the interior opening 369 of each cup-shaped head component 364 defines a respective head fill component 368.

The fill metal layer 430 may be deposited by a reactive PVD or CVD process without generating hillocks, which may provide an increased breakdown voltage for the resulting MIM capacitor module 302a, as compared with prior art designs that enable or encourage hillock formation on the capacitor bottom electrode (and/or other capacitor components), e.g., as discussed above regarding the example prior art capacitor module 10 shown in FIG. 1F.

In some examples, the fill metal layer 430 comprises titanium nitride (TiN) or other refractory metal (different from the conformal metal of the conformal metal layer 420) that has inherent compressive stresses (e.g., for a layer thickness of less than 1 μm). The inherent compressive stresses of the fill metal layer 430 (e.g., titanium nitride layer) may counteract the inherent tensile stresses of the underlying conformal metal layer 420 (e.g., tungsten layer), to thereby reduce the risk of inter-layer peeling, silicon wafer breakage, or other mechanical failure. In another example, the fill metal layer 430 is formed of aluminum, which may provide reduced resistance for the resulting bottom electrode 312 and metal heads 352a, 352b, but may introduce the possibility of hillock formation.

Figure 8B:
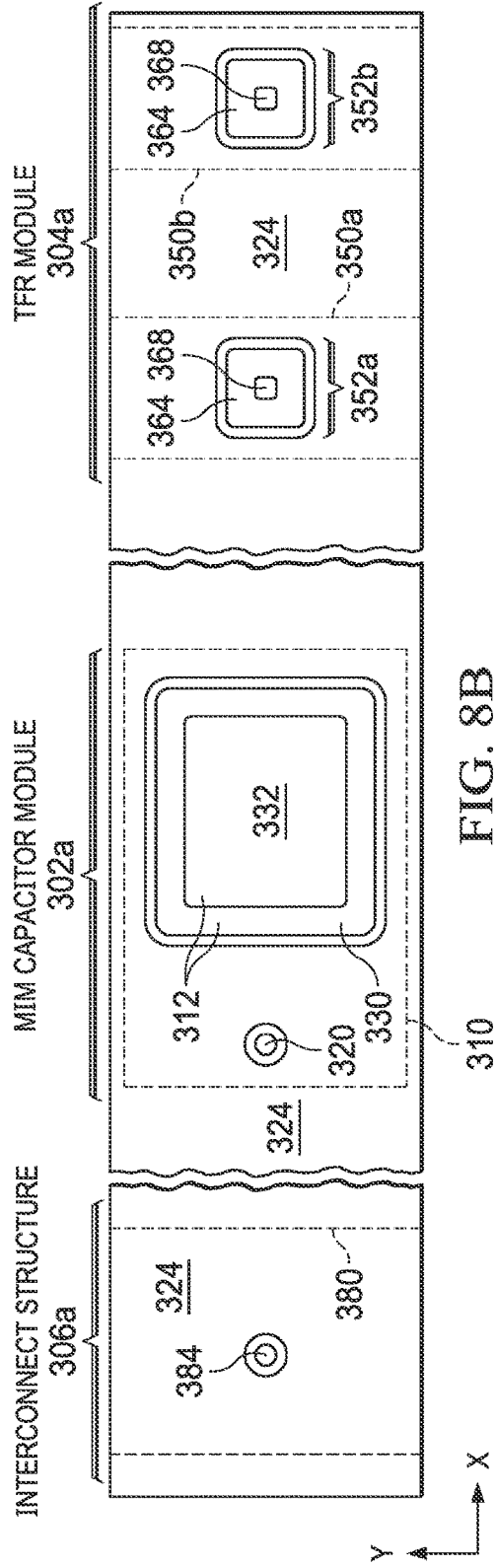
Figure 8A:
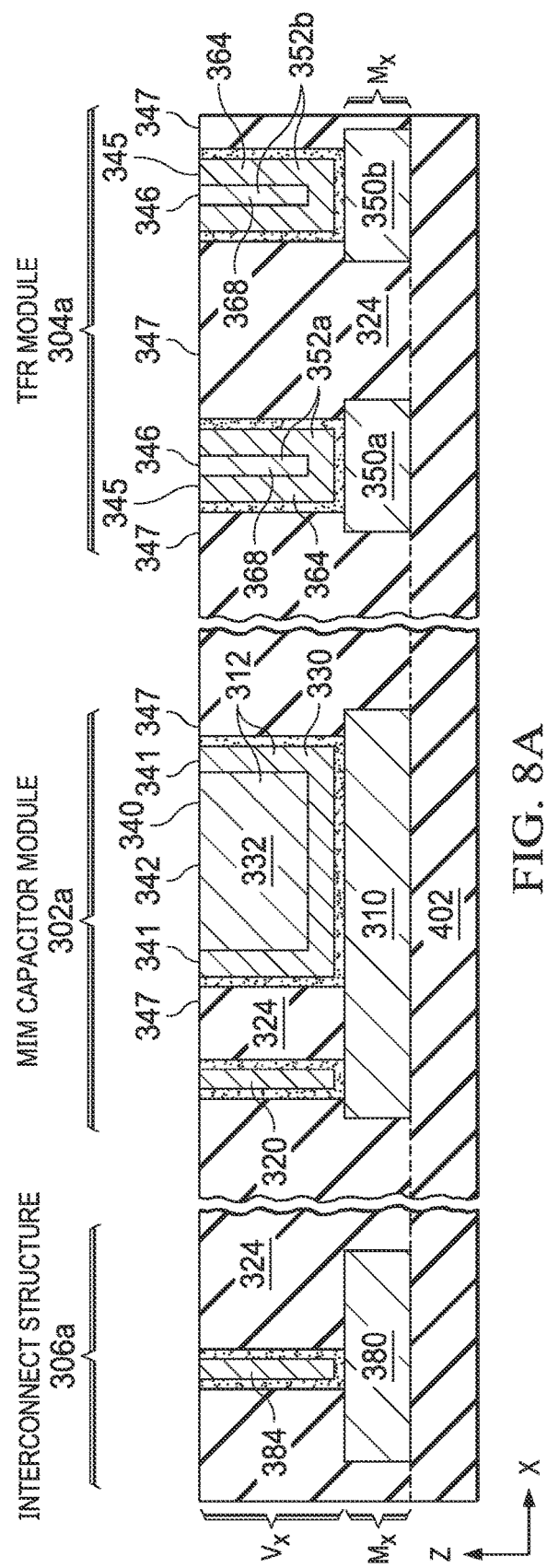

Next, as shown in FIG. 8A (cross-sectional side view) and corresponding FIG. 8B (top view), a planarization process (e.g., CMP process) is performed to remove upper portions of the fill metal layer 430, the conformal metal layer 420, and adhesive layer 326, and thereby define the final form of (a) the interconnect via 384, (b) the bottom electrode contact 320, (c) the cup-shaped bottom electrode component 330 and bottom electrode fill component 332 of the bottom electrode 312 of the MIM capacitor module 302a, and (d) the cup-shaped head component 364 and head fill component 368 of each metal head 352a, 352b of the TFR module 304a. The planarization process may be designed to stop on the dielectric region 324.

The planarization process (e.g., CMP process) defines a polished, planarized support surface 340 that includes (a) the planarized top surface 341 of the cup-shaped bottom electrode component 330, (b) the planarized top surface 342 of the bottom electrode fill component 332, (c) the planarized top surface 345 of each cup-shaped head component 368, (d) the planarized top surface 346 of each head fill component 368, and (e) the planarized top surface 347 of the dielectric region 324, including top surface areas of the dielectric region 324 on opposite lateral sides (in the x-direction, or in both the x-direction and y-direction) of each of the bottom electrode 312 and each metal head 352a, 352b.

The planarized support surface 340 provides a smooth, planarized surface free of hillocks. For example, the planarized top surfaces 341, 342, 345, and 346 (components of the planarized support surface 340) provide smooth, planarized surfaces of refractory metals used as the conformal metal layer 420 and fill metal layer 430 (e.g., tungsten and titanium nitride, as discussed above) that are free of hillocks, suitable for supporting the insulator 314 and resistor element 354. As discussed below, the resistor element 354 is formed from a resistor film 404 formed directly on the planarized support surface 340, whereas the insulator 314 is formed on a resistor film region 322 formed from the same resistor film 404. As discussed below, the resistor film 404 is formed as a planar layer with a uniform thickness across the planarized support surface 340; thus, the insulator 314 formed on the resistor film region 322 is also formed as a planar structure with a uniform thickness across the lateral width of the insulator 314 (in the x-direction, or both the x-direction and y-direction).

Figure 9:
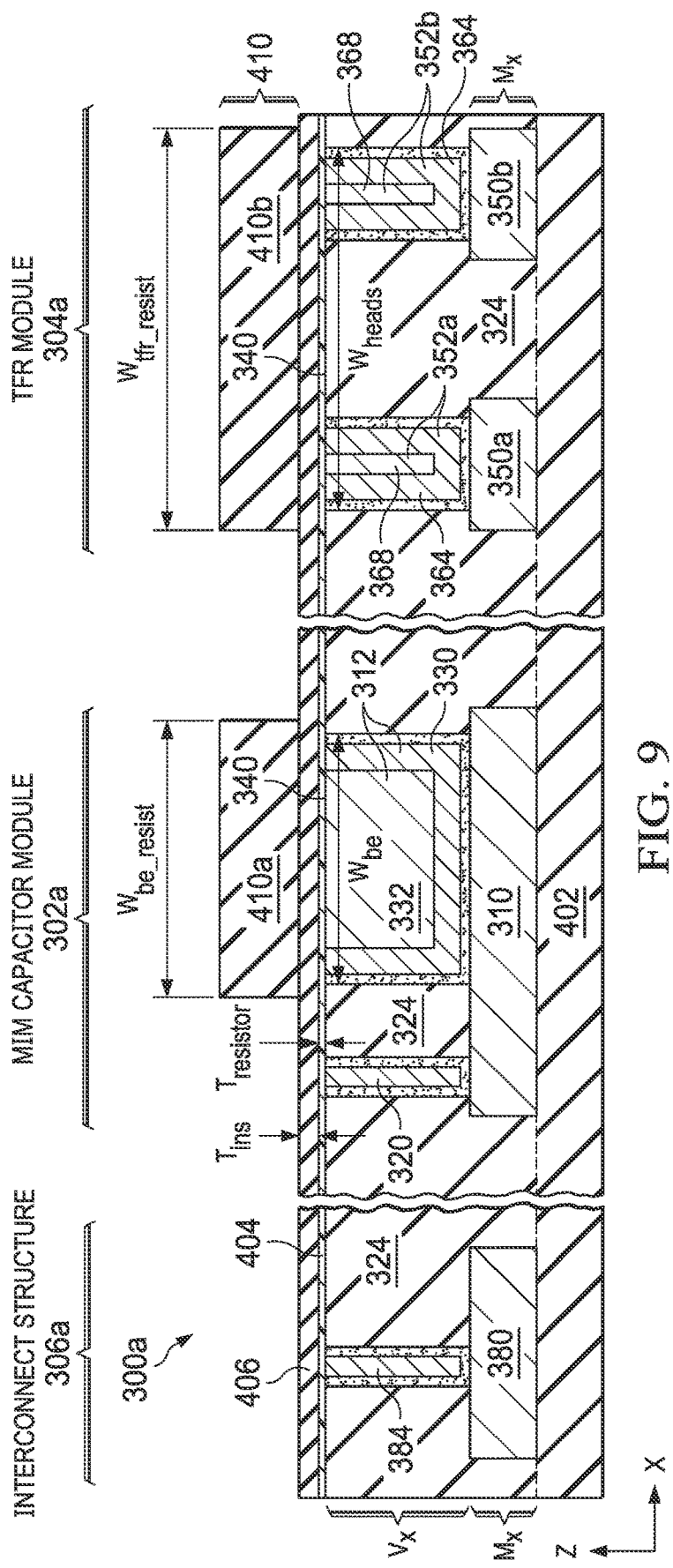

Next, as shown in FIG. 9, a resistor film 404 is deposited over the structure 300, followed by deposition of an insulator layer 406. In some examples, the resistor film 404 may comprise SiCCr, SiCr, NiCr, TaN, or other suitable material, deposited with a thickness $T_{resistor}$, which in one example may be in the range of 100-1000 Å, for example by a physical vapor deposition (PVD) process, and having a sheet resistance, in one example, in the range of 200-1,000 ohms per square. The insulator layer 406 may comprise silicon nitride ($Si_3N_4$, κ~7) deposited with a thickness $T_{ins}$, in one example in the range of 400-600 Å, for example by a PECVD deposition process. In other examples, the insulator layer 406 may comprise silicon oxide (Sift) or a high-k dielectric material, e.g., $Al_2O_3$ (κ~10), $Ta_2O_5$ (κ~25), $HfO_2$ (κ~22), or $ZrO_2$ (κ~35), e.g., deposited by a PECVD deposition process or an ALD (atomic layer deposition) process.

A photoresist layer is then deposited and patterned to form a photomask 410 over the insulator layer 406. The patterned photomask 410 includes a first photomask region 410a over the bottom electrode 312 of the MIM capacitor module 302a, and a second photomask 410b extending over the pair of metal heads 352a, 352b of the TFR module 304a. A lateral width $W_{be\_resist}$ of the first photomask region 410a extends laterally across and beyond a lateral width $W_{be}$ of the bottom electrode 312 in the x-direction, or in both the x-direction and y-direction. Similarly, a lateral width $W_{tfr\_resist}$ of the second photomask region 410b extends laterally across and beyond a lateral width $W_{heads}$ extending across both metal heads 352a, 352b in the x-direction, or in both the x-direction and y-direction.

Figure 10:
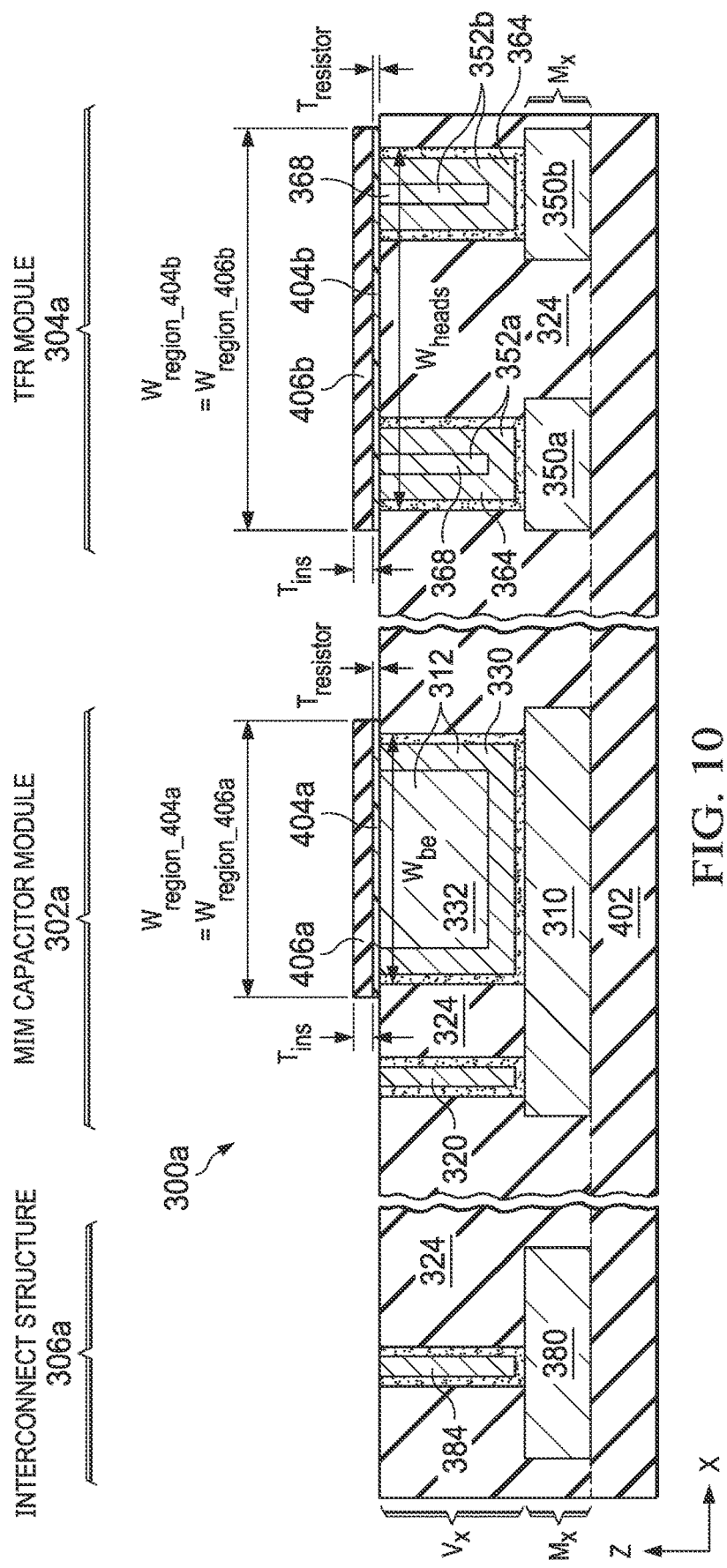

Next, as shown in FIG. 10, an etch is performed to remove portions of the insulator layer 406 and the resistor film 404 uncovered by the patterned photomask 410, leaving (a) a first resistor film region 404a and a first insulator layer region 406a below the first photomask region 410a and (b) a second resistor film region 404b and a second insulator layer region 406b below the second photomask region 410b. A lateral width of each of the first resistor film region 404a ($W_{region\_404a}$) and the first insulator layer region 406a ($W_{region\_406a}$) corresponds with the lateral width $W_{be\_resist}$ of the first photomask region 410a, such that each extends laterally across and beyond the lateral width $W_{be}$ of the bottom electrode in the x-direction, or in both the x-direction and y-direction. Similarly, a lateral width of each of the second resistor film region 404b ($W_{region\_404b}$) and the second insulator layer region 406b ($W_{region\_406b}$) corresponds with the lateral width $W_{tfr\_resist}$ of the second photomask region 410b, such that each extends laterally across and beyond the lateral width $W_{heads}$ extending across both metal heads 352a, 352b in the x-direction, or in both the x-direction and y-direction.

Figure 11:
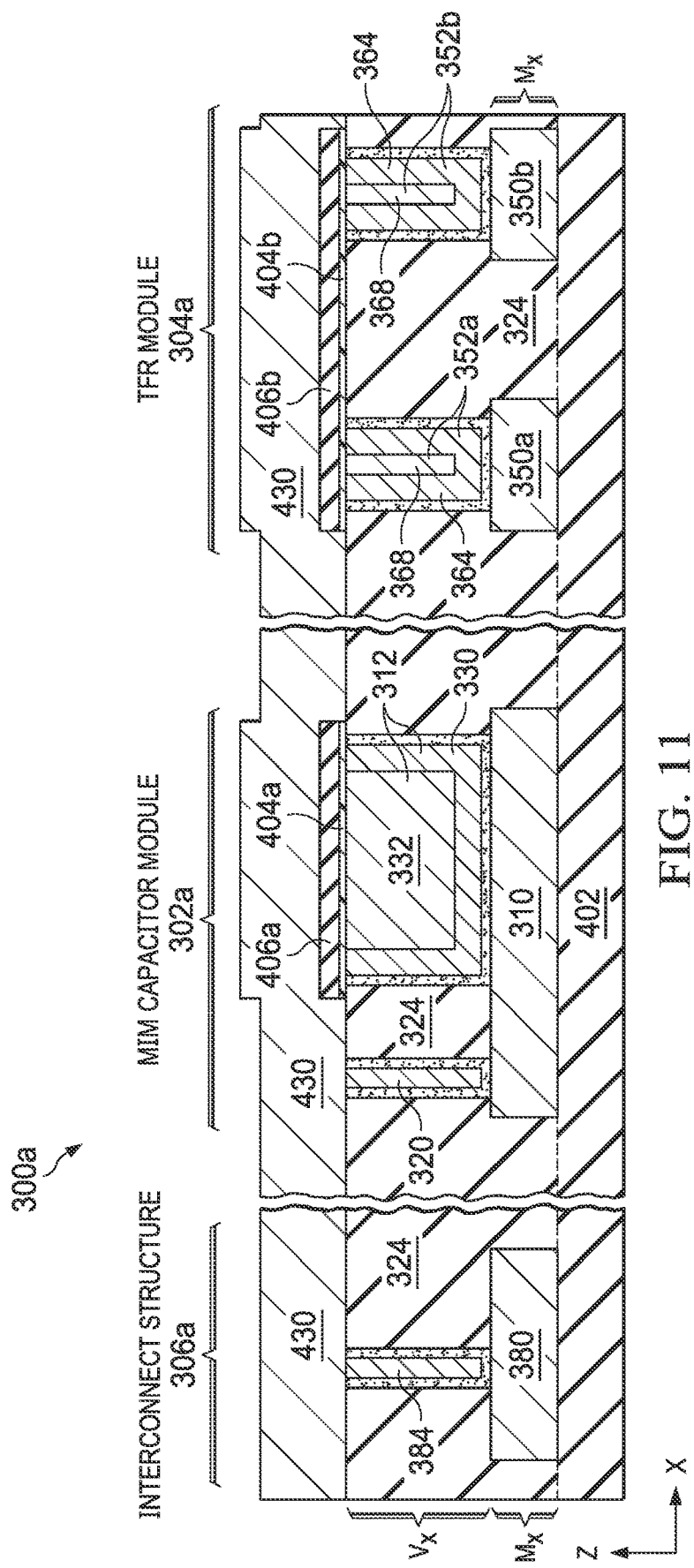

Next an upper metal interconnect layer $M_{x+1}$ is formed over the integrated circuit structure 300a. First, as shown in FIG. 11, an upper metal layer 430, e.g., comprising aluminum, copper, or other suitable metal, is deposited over the dielectric region 324 and the first and second insulator layer region 406a, 406bb.

Figure 12:
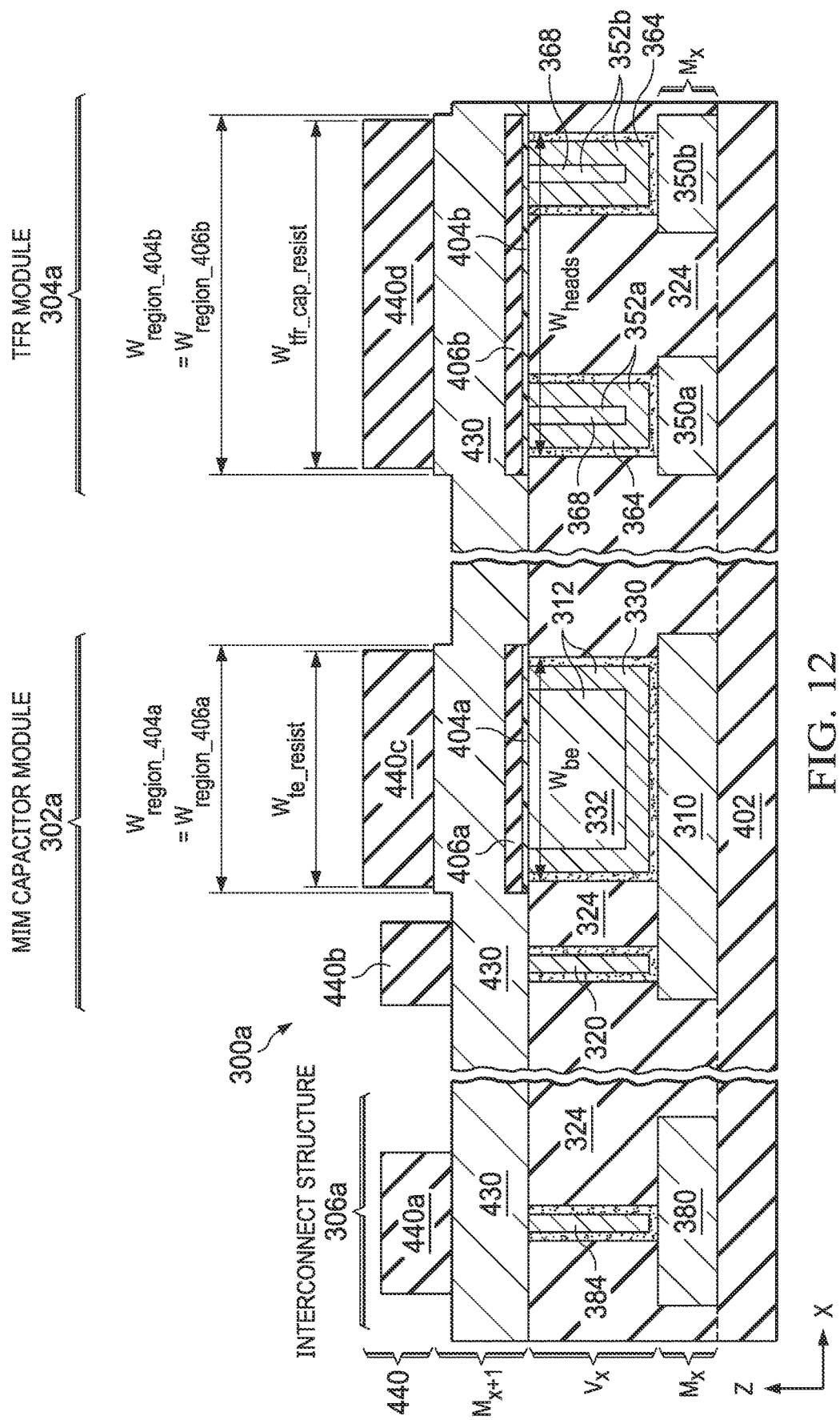

Next, as shown in FIG. 12, a photoresist layer is deposited and patterned to form a photomask 440 including (a) a first photomask element 440a for forming an upper interconnect contact 382, as discussed below), (b) a second photomask element 440b (for forming the bottom electrode connection element 318, as discussed below), (c) a third photomask element 440c (for forming the top electrode 316 and underlying insulator 314 and resistor film region 322, as discussed below), and (d) a fourth photomask element 440d (for forming the metal resistor cap element 362 and underlying insulator cap element 360 and resistor element 354, as discussed below).

As shown, a width $W_{te\_resist}$ of the third photomask element 440c may be larger than the width $W_{be}$ of the bottom electrode 312 but smaller than the width of the first resistor film region 404a and first insulator layer region 406a ($W_{region\_404a}$=$W_{region\_406a}$), such that the subsequent metal etch to form the top electrode 316 (see FIG. 13) self-aligns the lateral edges (in the x-direction, or both the x-direction and y-direction) of the top electrode 316 with the underlying insulator 314 and resistor film region 322 (see FIG. 13), while also preventing any etching of the bottom electrode 312.

Similarly, a width $W_{tfr\_cap\_resist}$ of the third photomask element 440d may be larger than the width $W_{heads}$ extending across both metal heads 352a, 352b but smaller than the width of the second resistor film region 404b and second insulator layer region 406b ($W_{region\_404b}$=$W_{region\_406b}$), such that the subsequent metal etch to form the metal resistor cap element 362 (see FIG. 13) self-aligns the lateral edges (in the x-direction, or both the x-direction and y-direction) of the metal resistor cap element 362 with the underlying resistor element 354 and insulator cap element 360 (see FIG. 13), while also preventing any etching of the metal heads 352a, 352b.

FIG. 13 shows the results of the metal etch through the photomask 440 shown in FIG. 12, and after removal of the photomask 440, e.g., by a resist strip process. The etch may be selective to etch through structures not covered by the photomask 440 (including portions of the upper metal layer 430, first and second insulator layer regions 406a, 406b, and portions of the first and second resistor film regions 404a, 404b not covered by the photomask 440, as shown in FIG. 12), but stop in the dielectric region 324, e.g., at a depth of 500-1000 Å into the dielectric region 324, for example. As shown, the etch forms (a) the upper interconnect element 382 in contact with the interconnect via 384, (b) the bottom electrode connection element 318 in contact with the bottom electrode contact 320, (c) the top electrode 316 and underlying insulator 314 and underlying resistor film region 322, and (d) the metal resistor cap element 362 and underlying insulator cap element 360 and resistor element 354.

As shown, as a result of the metal etch, the lateral edges of the top electrode 316 are aligned with corresponding lateral edges of the insulator 314 and the resistor film region 322. A lateral width of the top electrode 316 ($W_{te}$), the insulator 314 ($W_{ins}$), and the resistor film region 322 ($W_{resistor\_film\_region}$) each extends laterally across and beyond the lateral width $W_{be}$ of the bottom electrode in the x-direction, or in both the x-direction and y-direction.

Similarly, the lateral edges of the metal resistor cap element 362 are aligned with corresponding lateral edges of the underlying insulator cap element 360 and resistor element 354. A lateral width of metal resistor cap element 362 ($W_{metal\_cap}$), the insulator cap element 360 ($W_{ins\_cap}$), and the resistor element 354 ($W_{tfr\_element}$) each extends laterally across and beyond the lateral width $W_{heads}$ extending across both metal heads 352a, 352b in the x-direction, or in both the x-direction and y-direction.

Each of the resistor film region 322 and the resistor element 354 has the thickness ($T_{resistor}$) of the resistor film 404 from which they are formed, which thickness $T_{resistor}$ is uniform across the full lateral width (in the x-direction, or in both the x-direction and y-direction) of the resistor film region 322 and resistor element 354, respectively. Similarly, each of the insulator 314 and the insulator cap element 360 has the thickness ($T_{ins}$) of the insulator layer 406 from which they are formed, which thickness $T_{ins}$ is uniform across the full lateral width (in the x-direction, or in both the x-direction and y-direction) of the insulator 314 and insulator cap element 360, respectively.

In some examples, FIG. 13 shows the completed of MIM capacitor module 302a, TFR module 304a and interconnect structure 306a. After forming the MIM capacitor module 302a, TFR module 304a and interconnect structure 306a the process may continue with construction of additional interconnect structures, e.g., by forming further metal interconnect layers and/or dielectric layers.

Figure 14:
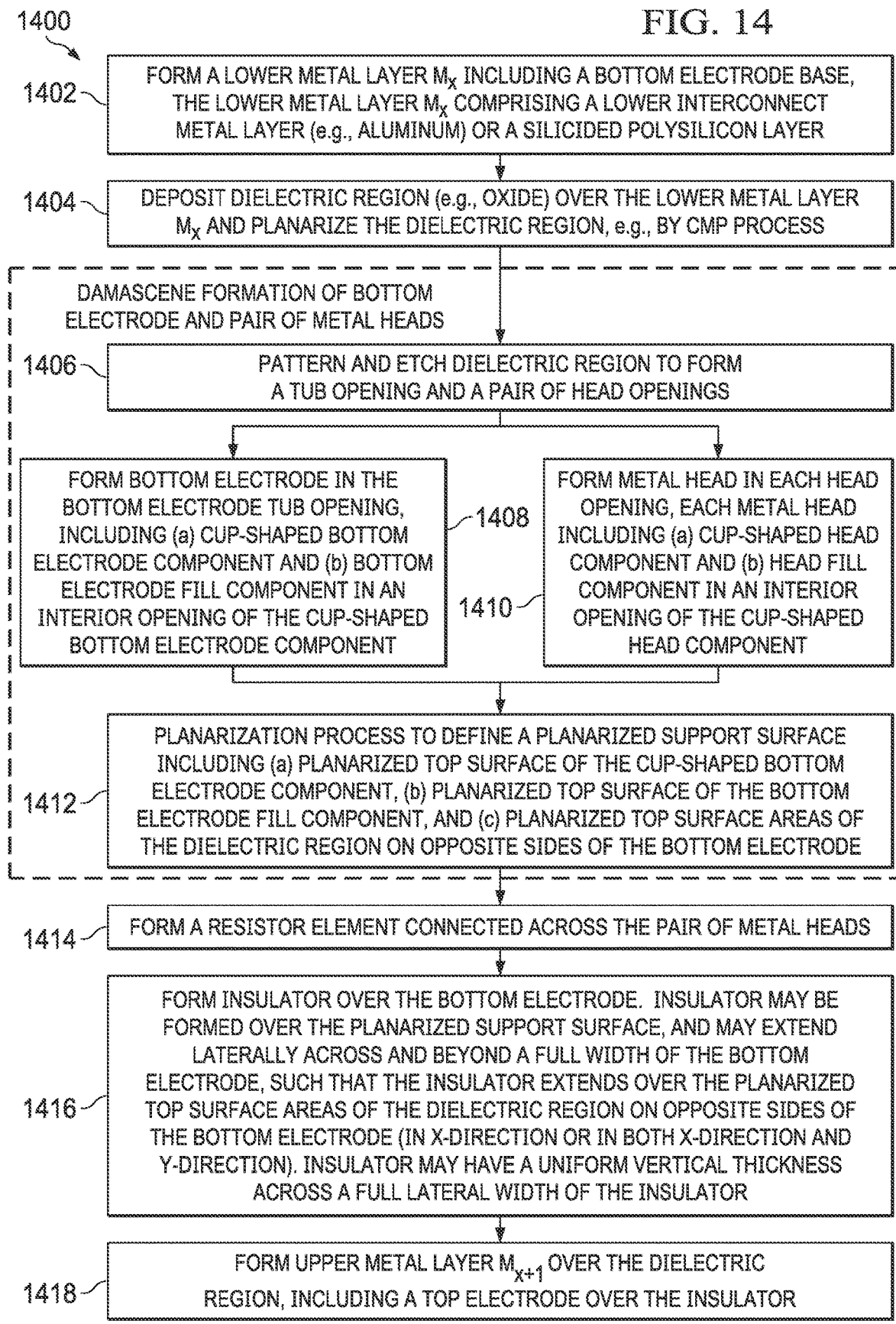
FIG. 14 is a flowchart showing an example method of forming an example integrated circuit structure including an example MIM capacitor module and an example TFR module, according to one example.

FIG. 14 is a flowchart showing an example method 1400 of forming an example integrated circuit structure including an example MIM capacitor module and an example TFR module, according to one example. At 1402, a lower metal layer $M_x$ is formed, including a bottom electrode base. In one example, the lower metal layer $M_x$ comprise a lower interconnect metal layer (e.g., comprising aluminum). In another example, the lower metal layer $M_x$ comprises a silicided polysilicon layer. At 1404, a dielectric region (e.g., an oxide region) is deposited over the lower metal layer $M_x$, and planarized, for example by a CMP process.

Next, as indicated by the dashed line box in FIG. 14, a damascene process may be performed at 1406-1412 to form a bottom electrode and a bottom electrode contact of the MIM capacitor module and a pair of metal heads of the TFR module.

First, at 1406, the dielectric region is patterned and etched to form a tub opening and a pair of head openings. At 1408, a bottom electrode is formed in the bottom electrode tub opening, the bottom electrode including (a) a cup-shaped bottom electrode component and (b) a bottom electrode fill component in an interior opening defined by the cup-shaped bottom electrode component.

At 1410, which may be performed concurrently with 1408, a metal head is formed in each of the pair of head tub openings, each metal head including (a) a cup-shaped head component; and (b) a head fill component in an interior opening defined by the cup-shaped head component.

At 1412, a planarization process is performed to define a planarized support surface including (a) a planarized top surface of the cup-shaped bottom electrode component, (b) a planarized top surface of the bottom electrode fill component, and (c) planarized top surface areas of the dielectric region on opposite sides of the bottom electrode.

At 1414, a resistor element connected across the pair of metal heads is formed from a resistor film formed on the planarized support surface.

At 1416, an insulator is formed on the bottom electrode of the MIM capacitor module. The insulator may be formed over the planarized support surface, and may extend laterally across and beyond a full width of the bottom electrode, such that the insulator extends over the planarized top surface areas of the dielectric region on opposite sides of the bottom electrode, in the x-direction or in both the x-direction and y-direction. The insulator may have a uniform vertical thickness across a full lateral width of the insulator. In some examples, as explained above, the insulator is formed over the resistor film, such that a resistor film region (formed on the planarized support surface) is arranged between the insulator and the planarized support surface. Like the insulator, the resistor film region may have a uniform vertical thickness across a full lateral width of the resistor film region.

At 1418, an upper metal layer is formed over the dielectric region, the upper metal layer including a top electrode over the insulator.

Figure 15A:
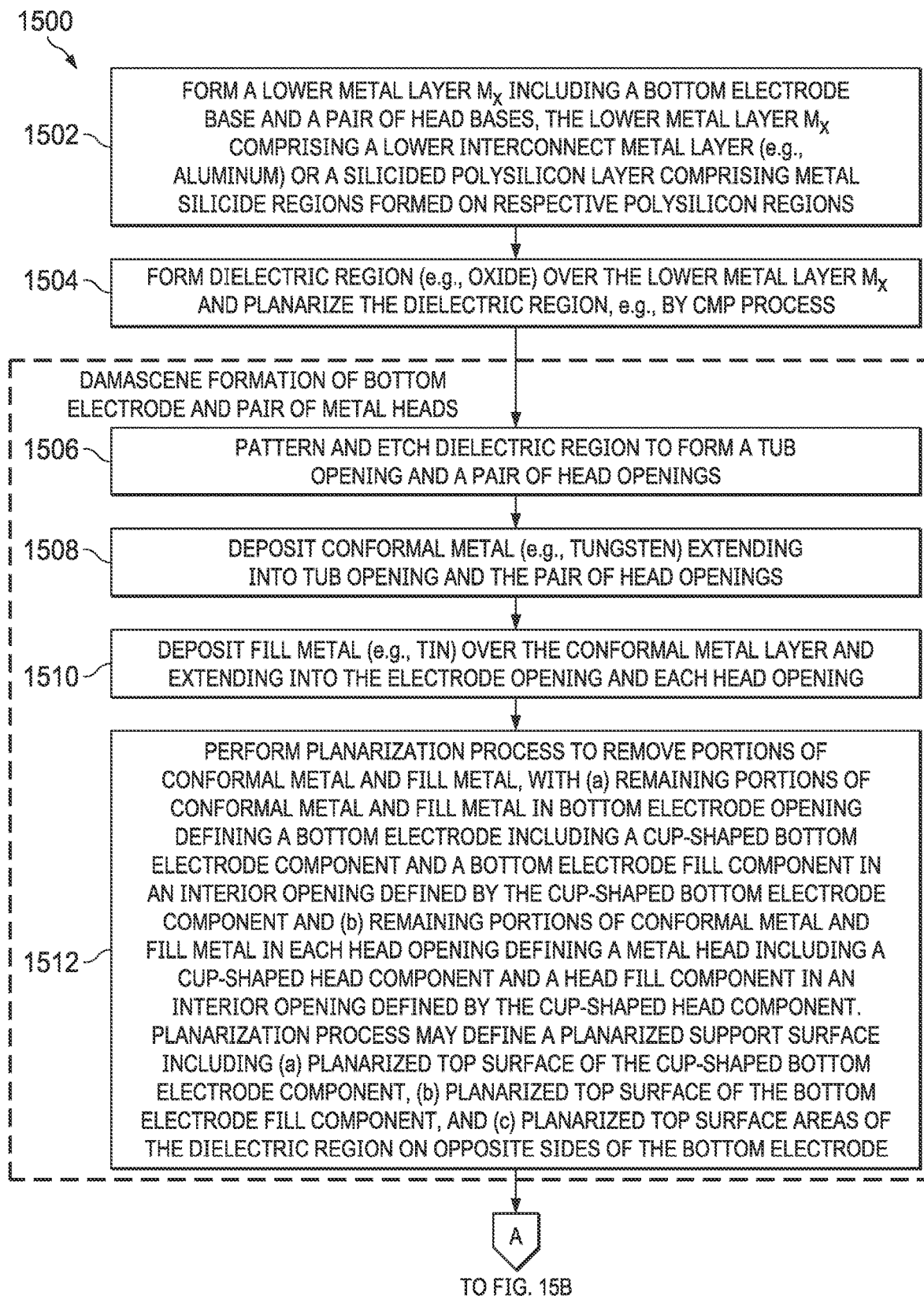
FIGS. 15A-15B illustrate a flowchart showing another example method of forming an example integrated circuit structure including an example MIM capacitor module and an example TFR module, according to another example.
Figure 15B:
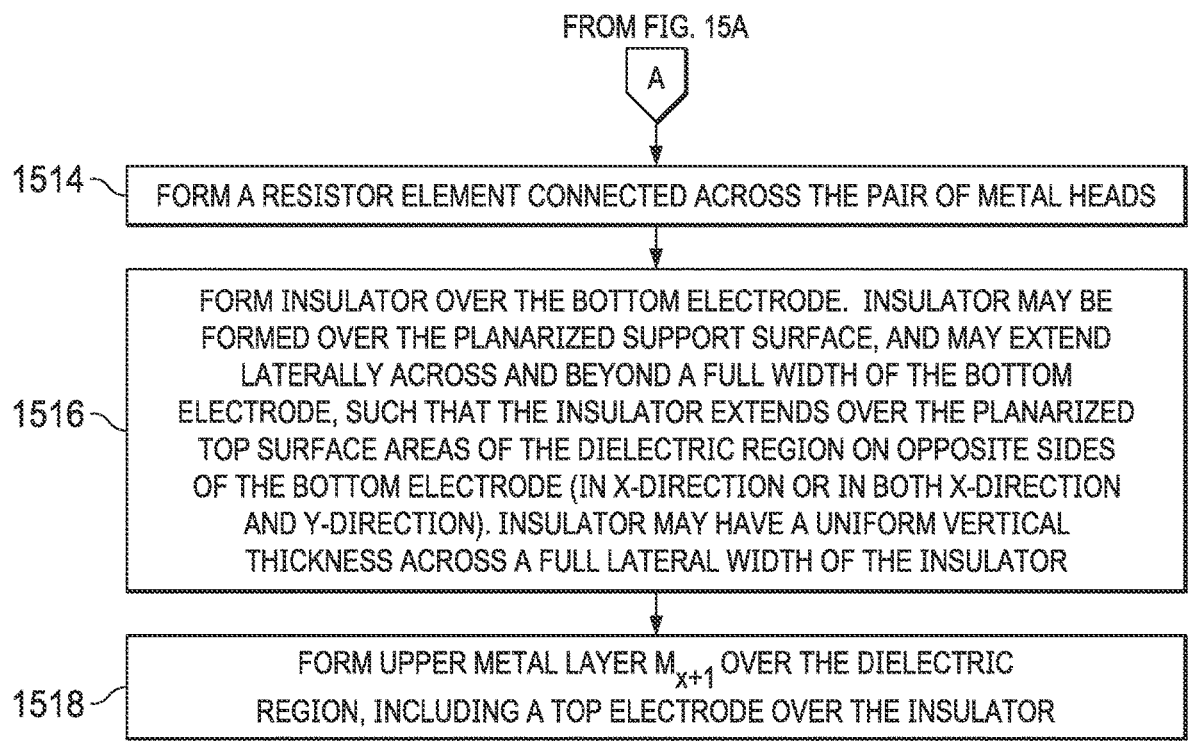

FIGS. 15A-15B illustrate a flowchart showing an example method 1500 of forming an example integrated circuit structure including an example MIM capacitor module and a TFR module, according to one example. At 1502, a lower metal layer $M_x$ is formed, including a bottom electrode base and a pair of head bases. In one example, the lower metal layer $M_x$ comprise a lower interconnect metal layer (e.g., comprising aluminum). In another example, the lower metal layer $M_x$ comprises a silicided polysilicon layer. At 1504, a dielectric region (e.g., an oxide region) is deposited over the lower metal layer $M_x$, and planarized, for example by a CMP process.

Next, as indicated by the dashed line box in FIG. 15A, a damascene process may be performed at 1506-1512 to form a bottom electrode and a pair of metal heads. At 1506, the dielectric region is patterned and etched to form (a) a tub opening and a pair of head openings. At 1508, a conformal metal (e.g., tungsten) is deposited and extends into the bottom electrode opening and the pair of head openings. At 1510, a fill metal (e.g., titanium nitride (TiN)) is deposited over the conformal metal and extends into the tub opening and the pair of head openings.

At 1512, a planarization process is performed to remove portions of conformal metal and fill metal, wherein (a) remaining portions of conformal metal and fill metal in bottom electrode opening define a bottom electrode including a cup-shaped bottom electrode component and a bottom electrode fill component in an interior opening defined by the cup-shaped bottom electrode component and (b) remaining portions of conformal metal and fill metal in each head opening define a metal head including a cup-shaped head component and a head fill component in an interior opening defined by the cup-shaped head component. The planarization process may define a planarized support surface including (a) a planarized top surface of the cup-shaped bottom electrode component, (b) a planarized top surface of the bottom electrode fill component, (c) planarized top surface areas of the dielectric region on opposite sides of the bottom electrode, (d) a planarized top surface area of the cup-shaped head component of each metal head, (e) a planarized top surface area of the fill component of each metal head, and (f) planarized top surface areas of the dielectric region laterally between and adjacent the pair of metal heads.

At 1514, a resistor element connected across the pair of metal heads is formed from a resistor film formed on the planarized support surface.

At 1516, an insulator is formed over the bottom electrode. The insulator may be formed over the planarized support surface, and may extend laterally across and beyond a full width of the bottom electrode, such that the insulator extends over the planarized top surface areas of the dielectric region on opposite sides of the bottom electrode (in x-direction or in both x-direction and y-direction). In some examples, the insulator may be formed as a planar insulator having a uniform vertical thickness across a full lateral width of the insulator. In some examples, as explained above, the insulator is formed over the resistor film, such that a resistor film region (arranged on the planarized support surface) is arranged between the insulator and the planarized support surface. Like the insulator, the resistor film region may have a uniform vertical thickness across a full lateral width of the resistor film region.

At 1518, an upper metal layer is formed over the dielectric region, the upper metal layer including a top electrode over the insulator.

The invention claimed is:

1. An integrated circuit structure, comprising:
   (a) a metal-insulator-metal capacitor module, comprising:
      a bottom electrode base formed in a lower metal layer;
      a bottom electrode formed in a dielectric region between the lower metal layer and an upper metal layer, the bottom electrode comprising:
         a cup-shaped bottom electrode component; and
         a bottom electrode fill component formed in an interior opening defined by the cup-shaped bottom electrode component;
      an insulator formed over the bottom electrode; and
      a top electrode formed in the upper metal layer over the insulator; and
   (b) a thin-film resistor module, comprising:
      a pair of metal heads formed in the dielectric region between the lower metal layer and the upper metal layer, wherein each metal head comprises:

a cup-shaped head component; and
a head fill component formed in an interior opening defined by the cup-shaped head component; and
a resistor element connected across the pair of metal heads;
wherein the cup-shaped bottom electrode component of the bottom electrode and the cup-shaped head component of each metal head comprise respective portions of the same conformal metal layer comprising a conformal metal; and
wherein the bottom electrode fill component of the bottom electrode and the head fill component of each metal head comprise respective portions of the same fill metal layer comprising a fill metal different than the conformal metal; and
(c) an interconnect via extending vertically through the dielectric region between the lower metal layer and the upper metal layer, wherein the interconnect via is formed from a further respective portion of the conformal metal layer, and wherein the interconnect via is free of the fill metal.

2. The integrated circuit structure of claim 1, wherein the thin-film resistor module includes a pair of head bases formed in the lower metal layer, wherein each metal head is conductively connected to a respective head base.

3. The integrated circuit structure of claim 1, wherein the conformal metal comprises tungsten, and the fill metal comprises titanium nitride.

4. The integrated circuit structure of claim 1, wherein the insulator has a uniform vertical thickness across a full lateral width of the insulator.

5. The integrated circuit structure of claim 1, wherein the insulator is formed over a planarized support surface including a planarized top surface of the cup-shaped bottom electrode component and a planarized top surface of the bottom electrode fill component.

6. The integrated circuit structure of claim 5, comprising a resistor film region formed on the planarized support surface, the resistor film region having a uniform vertical thickness across a full lateral width of the resistor film region;
wherein the insulator is formed on the resistor film region, the insulator having a uniform vertical thickness across a full lateral width of the insulator.

7. The integrated circuit structure of claim 1, wherein:
the insulator is formed on a planarized support surface including (a) a planarized top surface of the cup-shaped bottom electrode component, (b) a planarized top surface of the bottom electrode fill component, and (c) planarized top surface areas of the dielectric region on opposite sides of the bottom electrode; and
the insulator extends laterally across and beyond a full width of the bottom electrode, such that the insulator extends over the planarized top surface areas of the dielectric region on opposite sides of the bottom electrode.

8. The integrated circuit structure of claim 1, wherein:
the thin-film resistor module includes a resistor element insulator cap element formed on the resistor element; and
the resistor element insulator cap element is formed from a common insulator material as the insulator.

9. The integrated circuit structure of claim 1, wherein:
the lower metal layer comprises a lower interconnect layer; and
the upper metal layer comprises an upper interconnect layer.

10. The integrated circuit structure of claim 1, wherein:
the lower metal layer comprises a silicided polysilicon layer, wherein the bottom electrode base formed in the lower metal layer comprises a metal silicide region formed on a polysilicon region; and
the upper metal layer comprises a first metal interconnect layer.

11. The integrated circuit structure of claim 1, wherein the metal-insulator-metal capacitor module comprises:
a bottom electrode connection element formed in the upper metal layer; and
a bottom electrode contact formed in the dielectric region between the lower metal layer and the upper metal layer;
wherein the bottom electrode contact provides a conductive connection between the bottom electrode connection element formed in the upper metal layer and the bottom electrode base formed in the lower metal layer.

12. The integrated circuit structure of claim 1, further comprising an interconnect structure including:
a lower interconnect element formed in the lower metal layer; and
an upper interconnect contact formed in the upper metal layer and connected to the lower interconnect element by at least the interconnect via.

13. The integrated circuit structure of claim 12, wherein the at least one interconnect via and the cup-shaped bottom electrode component are formed from a common conformal metal.

14. An integrated circuit structure, comprising:
(a) a metal-insulator-metal capacitor module, comprising:
a bottom electrode formed in a dielectric region, the bottom electrode comprising:
a cup-shaped bottom electrode component; and
a bottom electrode fill component formed in an interior opening defined by the cup-shaped bottom electrode component;
an insulator formed over the bottom electrode; and
a top electrode formed over the insulator; and
(b) a thin-film resistor module, comprising:
a pair of metal heads formed in the dielectric region, wherein each metal head comprises:
a cup-shaped head component; and
a head fill component formed in an interior opening defined by the cup-shaped head component; and
a resistor element connected across the pair of metal heads;
wherein the cup-shaped head component of each metal head and the cup-shaped bottom electrode component comprise respective portions of the same conformal metal layer comprising a conformal metal deposited in respective openings in the dielectric region; and
wherein the head fill component of each metal head and the bottom electrode fill component comprise respective portions of the same fill metal layer comprising a fill metal different than the conformal metal; and
(c) an interconnect via extending vertically through the dielectric region between the lower metal layer and the upper metal layer, wherein the interconnect via is formed from a further respective portion of the conformal metal layer, and wherein the interconnect via is free of the fill metal.

\* \* \* \* \*